US012116667B2

(12) United States Patent
Kim et al.

(10) Patent No.: US 12,116,667 B2
(45) Date of Patent: Oct. 15, 2024

(54) METHOD OF AREA-SELECTIVE DEPOSITION AND METHOD OF FABRICATING AN ELECTRONIC DEVICE USING THE SAME

(71) Applicants: SK hynix Inc., Icheon (KR); Industry-University Cooperation Foundation Hanyang University ERICA Campus, Ansan (KR)

(72) Inventors: Woo-Hee Kim, Siheung (KR); Jinseon Lee, Jeonju (KR); Daehyun Kim, Icheon (KR); Changhan Kim, Icheon (KR)

(73) Assignees: SK hynix Inc., Icheon (KR); Industry-University Cooperation Foundation Hanyang University ERICA Campus, Ansan (KR)

( * ) Notice: Subject to any disclaimer, the term of this patent is extended or adjusted under 35 U.S.C. 154(b) by 283 days.

(21) Appl. No.: 17/584,273

(22) Filed: Jan. 25, 2022

(65) Prior Publication Data
US 2022/0235461 A1    Jul. 28, 2022

(30) Foreign Application Priority Data
Jan. 25, 2021    (KR) ........................ 10-2021-0010480

(51) Int. Cl.
*C23C 16/455*    (2006.01)
*C23C 16/44*    (2006.01)
(Continued)

(52) U.S. Cl.
CPC .... *C23C 16/45527* (2013.01); *C23C 16/4408* (2013.01); *H01L 21/02126* (2013.01); *H01L 21/31116* (2013.01)

(58) Field of Classification Search
CPC ........... C23C 16/45527; C23C 16/402; C23C 16/04; H01L 21/02126
See application file for complete search history.

(56) References Cited

U.S. PATENT DOCUMENTS

2007/0275166 A1\* 11/2007 Thridandam ......... C23C 16/402
427/248.1
2015/0021513 A1\* 1/2015 Kim .................. H01L 21/31055
252/79.4
(Continued)

FOREIGN PATENT DOCUMENTS

JP        2019212805 A    12/2019
KR    1020200079343 A     7/2020

*Primary Examiner* — Joseph A Miller, Jr.

(57) ABSTRACT

An area-selective deposition method may include providing a substrate structure including a silicon oxide area and a silicon nitride area; performing a surface treatment on the silicon oxide area and the silicon nitride area of the substrate structure to form a first functional group on a surface of the silicon oxide area and to form a second functional group on a surface of the silicon nitride area; and performing an atomic layer deposition (ALD) process in a chamber in which the substrate structure is disposed, to selectively form a silicon oxide layer on the silicon oxide area among the silicon nitride area and the silicon oxide area. The ALD process may include: supplying an aminosilane-based silicon precursor into the chamber; purging the chamber with a first purge gas; supplying an oxygen-containing source into the chamber; and purging the chamber with a second purge gas.

18 Claims, 27 Drawing Sheets

(51) Int. Cl.
*H01L 21/02* (2006.01)
*H01L 21/311* (2006.01)

(56) References Cited

U.S. PATENT DOCUMENTS

| | | | |
|---|---|---|---|
| 2017/0154806 A1* | 6/2017 | Wang | H01L 21/7685 |
| 2018/0233349 A1* | 8/2018 | Smith | C23C 16/0272 |
| 2018/0308680 A1* | 10/2018 | Reddy | H01L 21/67201 |
| 2020/0312653 A1* | 10/2020 | Fredrickson | C23C 16/45534 |

\* cited by examiner

Initial surface state

Surface treatment

Si precursor supply

AS-ALD process

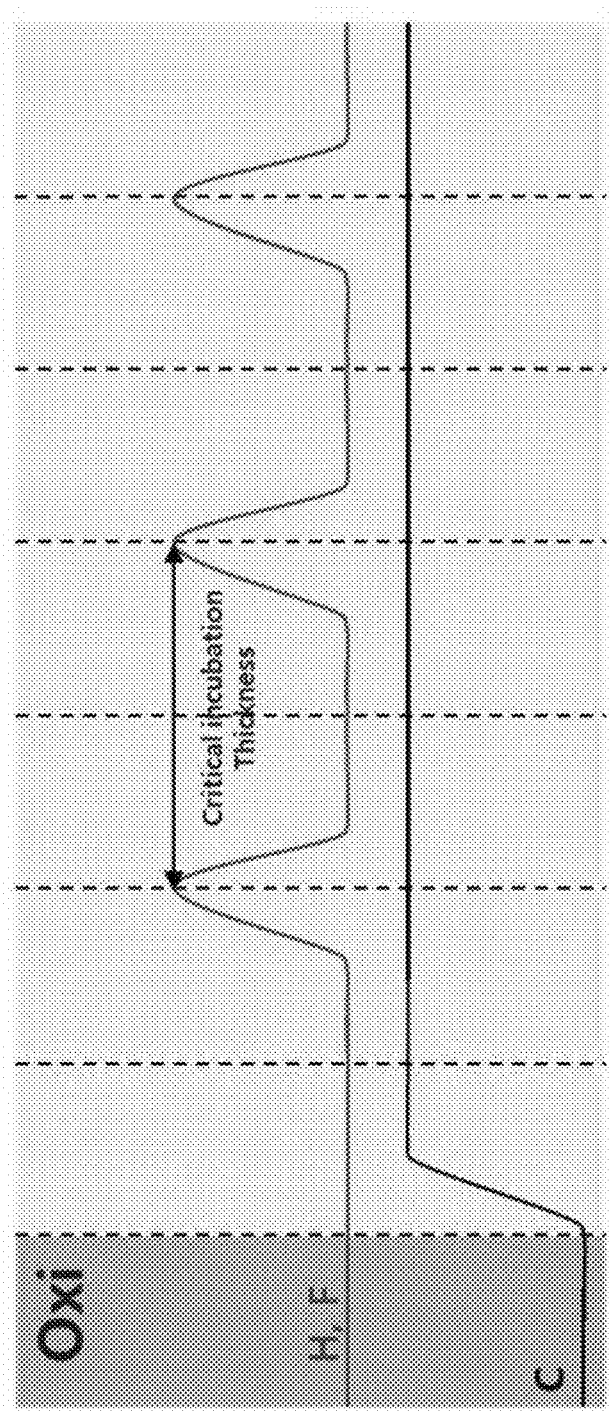

METHOD OF AREA-SELECTIVE DEPOSITION AND METHOD OF FABRICATING AN ELECTRONIC DEVICE USING THE SAME

CROSS-REFERENCES TO RELATED APPLICATION

The present application claims the benefit of Korean application number 10-2021-0010480, filed on Jan. 25, 2021, which is herein incorporated by reference in its entirety.

BACKGROUND OF THE INVENTION

1. Field

The present disclosure relates to method of thin film deposition and method of fabricating a device, and more particularly to an area-selective deposition method and method of fabricating an electronic device using the same.

2. Description of the Related Art

As the degree of integration and aspect ratio of various electronic devices, including semiconductor devices, increase, various limitations and problems may arise in conventional top-down lithography and etching processes performed from top to bottom of the structure. For example, with higher integration of memory devices, the aspect ratio and number of stacked three-dimensional vertical NAND (i.e., V-NAND) devices have increased, and the tier size is decreasing in the vertical direction. Thus, when cells having an information storage film such as a charge trapping layer are formed by a conventional top-down lithography/etching process, the process may result in non-uniformity between cells, which in turn causes interference problems or operation errors Accordingly, there is a need for technology development and related research to overcome the limitations of conventional top-down device fabrication and to extend the degree of freedom of atomic scale patterning methods in three-dimensional structures. Technology development of an ultra-precision patterning method applicable inside a three-dimensional NAND device can overcome scaling limitations for next-generation NAND flash device development and can further increase the number of stacked layers.

SUMMARY OF THE INVENTION

A technical problem to be solved by the present disclosure is to overcome the limitations of conventional top-down type deposition and device fabrication, and to provide an area-selective deposition method capable of extending the degree of freedom of deposition and patterning methods for various substrate structures including a three-dimensional structure.

Another technical problem to be solved by the present disclosure is to provide an area-selective deposition method which is advantageous for manufacturing a high-aspect-ratio and/or high-integration device in connection with manufacturing a three-dimensional V-NAND device, and which is capable of extending the degrees of freedom of the device integration process.

Another technical problem to be solved by the present disclosure is to provide a method for manufacturing an electronic device to which the area-selective deposition method described above is applied.

The problems to be solved by the present disclosure are not limited to the above-mentioned problems, and other problems not mentioned will be understood by those skilled in the art from the following description.

According to an example of the present disclosure, there is provided an area-selective deposition method including: providing a substrate structure including a silicon oxide area and a silicon nitride area; performing surface treatment on the silicon oxide area and the silicon nitride area of the substrate structure to form a first functional group on a surface of the silicon oxide area and to form a second functional group on a surface of the silicon nitride area; and performing an atomic layer deposition (ALD) process in a chamber provided with the substrate structures to selectively form a silicon dioxide layer on the silicon oxide area among the silicon oxide area and the silicon nitride area, wherein the ALD process includes: a first supplying step of supplying an aminosilane-based silicon precursor into the chamber; a first purging step of purging the chamber with a first cleaning gas; a second supplying step of supplying an oxygen-containing source into the chamber; and a second purging step of purging the chamber with a second purge gas.

The surface treatment may be performed with a solution containing hydrogen fluoride (HF). In another example, the surface treatment may be performed by a dry process containing fluorine (F), and in some examples, the dry process may be carried out by plasma treatment with at least one of $N_2$, $NH_3$, $N_2H_4$, $H_2$, or a mixed gas of two or more thereof, together with or instead of the fluorine.

The first functional group may include an —OH functional group, and the second functional group may include an —NH2 functional group.

The aminosilane based silicon precursor may include diisopropylaminosilane (DIPAS).

The aminosilane-based silicon precursor can be selectively adsorbed to the first functional group among the first functional group and the second functional group to form $SiH_3$ on the silicon oxide area.

The oxygen-containing source may include ozone (O3).

The process temperature of the ALD process may be about 150° C. or less.

The step of forming the silicon oxide layer may include a repeated deposition step of repeating the first supply step, the first purge step, and the second supply step a plurality of times. The area-selective deposition method may further include an etching step of performing an etching process on the silicon oxide area and the silicon nitride area after the repeated deposition step. The repeated deposition step and the etching step may be performed alternately and repeatedly.

The ALD process may further include introducing a reaction inhibitor selectively on the silicon nitride area among the silicon oxide area and the silicon nitrides area.

The step of introducing the reaction inhibitor may include, between the first purging step and the second supply step, a third supply step of supplying an inhibitor precursor material into the chamber and a third purging step of purging the chamber with a third purge gas.

The inhibitor precursor material may include N,N-diethylamino trimethylsilane (DEATMS).

The inhibitor precursor material may form $Si(CH_3)_3$ on the silicon nitride area.

After forming the silicon oxide layer, the method may further include selectively forming a silicon nitride layer on the silicon nitride area among the silicon dioxide area and silicon nitride area.

The substrate structure may include a stacked body in which a silicon oxide thin film and a silicon nitride thin film are alternately and repeatedly stacked on an upper surface of a substrate, the stacked body may be provided with at least one opening extending through the silicon oxide thin film and the silicon nitride thin film, and the silicone oxide layer may be selectively formed over a side surface of the silicon oxide thin film exposed to an inner side surface of the opening area.

The substrate structure may include at least one silicon oxide area and at least one silicon nitride area arranged on a top surface of a substrate in a direction parallel to the substrate.

According to another example of the present disclosure, there is provided a method of manufacturing an electronic device, including: providing a substrate structure including a silicon oxide area and a silicon nitride area; and forming a material film on the substrate structure by using the area-selective deposition method described above.

The electronic device may include, for example, a three-dimensional V-NAND device.

The substrate structure may include a stacked body in which a silicon oxide thin film and a silicon nitride thin film are alternately and repeatedly stacked on an upper surface of a substrate, the stacked body may be provided with at least one opening area extending through the silicon oxide thin film and the silicon nitride thin film, and a silicon oxide layer may be formed, by using the area-selective deposition method, over a side surface of the silicone oxide thin film exposed to an inner side surface of the opening area.

According to examples of the present disclosure, it is possible to implement an area-selective deposition method which overcomes limitations and problems of conventional top-down type deposition and device fabrication, and which can expand the degree of freedom of the deposition and patterning methods with regard to various substrate structures including three-dimensional structures. In particular, the application of the area-selective deposition method according to examples of the present disclosure may be advantageous in the manufacture of three-dimensional V-NAND devices, in the fabrication of high-aspect-ratio/high-integration devices, and may extend the degree of freedom of the device integration process.

The area-selective deposition method according to examples may be advantageously applied to the manufacture of a variety of electronic devices, including three-dimensional V-NAND devices.

BRIEF DESCRIPTION OF THE DRAWINGS

FIG. 24 illustrates analysis data showing a case where the ratio of H and F elements contained in an ASD $SiO_2$ thin film is increased every period corresponding to a critical incubation thickness.

DETAILED DESCRIPTION OF THE INVENTION

Examples of the present disclosure will now be described in detail with reference to the accompanying drawings. The examples of the present disclosure which will be described below are provided to more clearly illustrate the present disclosure to those skilled in the art. The scope of the present disclosure is not limited by the following examples, and the following examples can be modified in various different forms.

The terminology used herein is for the purpose of describing particular examples only and is not intended to be limiting of the present disclosure. As used herein, the singular forms may include the plural forms as well, unless the context clearly indicates otherwise. In addition, the terms "comprises" and/or "comprising," when used in this specification, specify the presence of stated features, steps, numbers, operations, members, elements, and/or groups thereof, and do not preclude the presence or addition of one or more other features, steps, numbers, operations, members, elements, and/or groups thereof. Furthermore, the term "connection" as used herein is intended to mean not only that certain members are directly connected, but also that another member may be further interposed therebetween and thus the certain members are indirectly connected.

Furthermore, when a member is referred to herein as being "on" another member, this includes not only the case where the member is in contact with the other member, but the case where there is another object between the two members. The term "and/or" as used herein includes any and all combinations of one or more of the listed items in question. In addition, the terms "about," "substantially," and the like, as used herein, are used in light of manufacturing and material tolerances, and in the sense of being close to or within the category of a numerical value or extent indicated thereby.

Examples of the present disclosure will now be described in detail with reference to the accompanying drawings. The size or thickness of the areas or parts shown in the accompanying drawings may be somewhat exaggerated for clarity of the specification and convenience of explanation. The same numerical references refer to the same elements throughout the detailed description.

FIGS. 1A to 1D are perspective views illustrating an area-selective deposition method according to an example of the present disclosure.

Figure 1A:
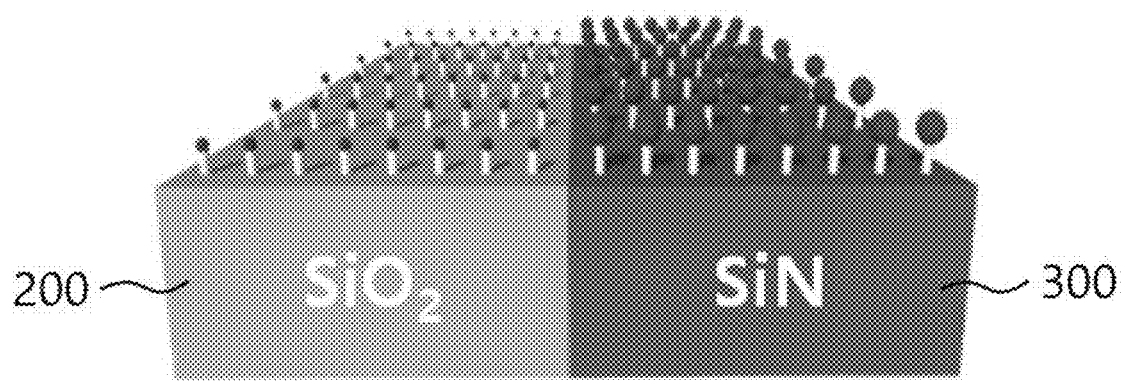
FIGS. 1A to 1D are perspective views illustrating an area-selective deposition method according to an example of the present disclosure.

Referring to FIG. 1A, a substrate structure including a substrate (not shown) with a silicon oxide area 200 and a silicon nitride area 300 on the substrate may be provided. The substrate may be a silicon substrate, another semiconductor substrate, or a different type of substrate other than a semiconductor. The type of the substrate is not particularly limited. The silicon oxide area 200 may be an area of $SiO_x$ and the silicon nitride area 300 may be the area of $Si_xN_y$. The $SiO_x$ may be not only a stoichiometric silicon oxide with X=2, but also an oxygen-deficient or oxygen-rich silicon oxide. Similarly, the $Si_xN_y$ may be a stoichiometric silicon nitride such as $Si_3N_4$ or a nitrogen-deficient or nitrogen-rich silicon nitride.

Figure 1B:
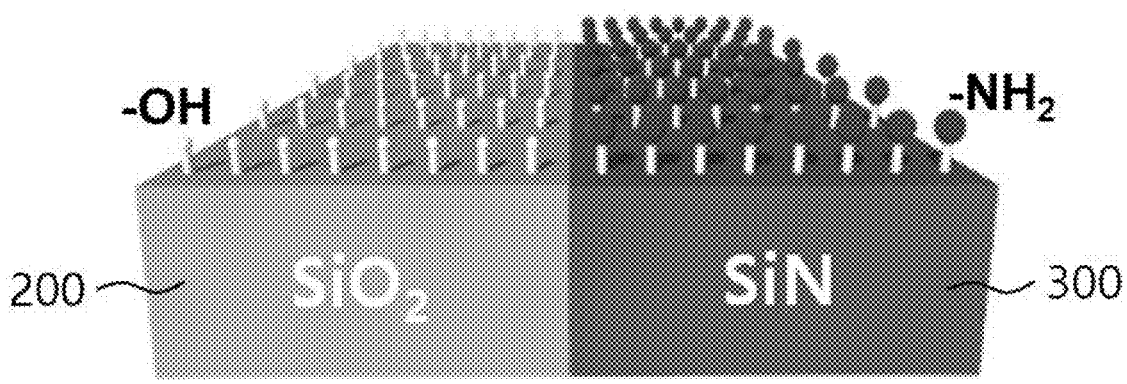

Referring to FIG. 1B, optionally, a surface treatment may be performed on the silicon oxide area 200 and the silicon nitride area 300 of the substrate structure to form a hydrogen-containing first functional group on the surface of the silicon oxide area 200, and a hydrogen-containing second functional group on the surface of the silicon nitride area 300. The surface treatment may be performed, for example, with a solution containing hydrogen fluoride (HF). The first functional group formed on the surface of the silicon oxide area 200 by the surface treatment may be or may include —OH, and the second functional group formed on the surface of the silicon nitride area 300 may be or may include —$NH_2$.

Figure 1C:
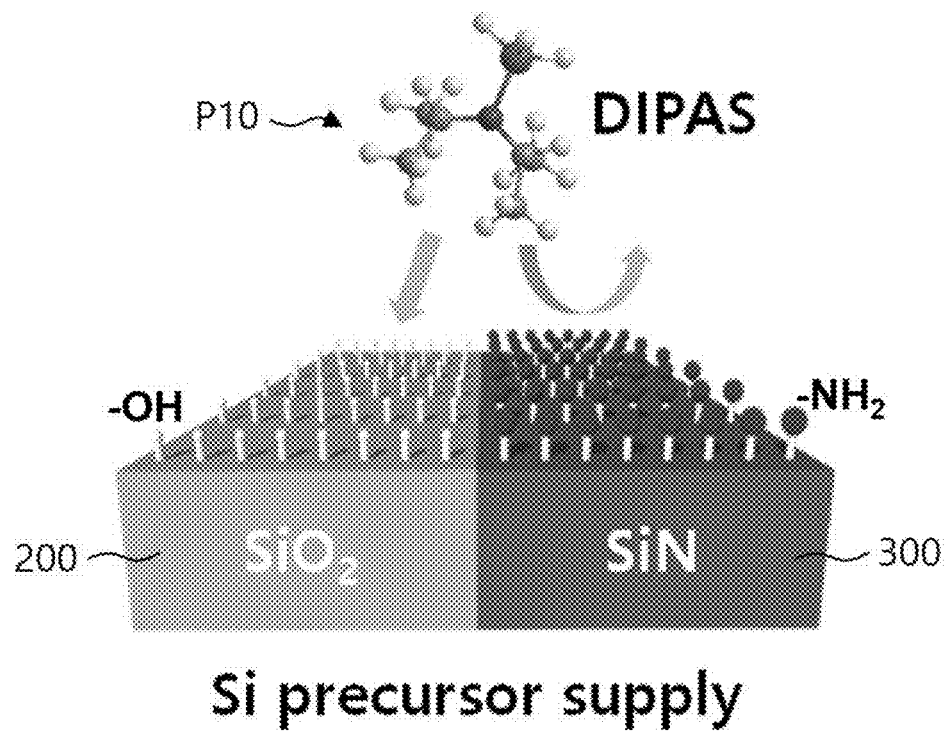

Referring to FIG. 1C, an atomic layer deposition (hereinafter, referred to as ALD) process using an aminosilane-based silicon precursor P10 may be performed on the silicon oxide area 200 and the silicon nitride area 300 in a chamber in which the substrate structure is mounted. The ALD process may include a first supply step of supplying the aminosilane-based silicon precursor P10 into the chamber, a first purge step of purging the chamber with a first purge gas, a second supply step of supplying an oxygen-containing source into the chamber, and a second purge step of purging the chamber with a second purge gas. FIG. 1C shows the first supply step of supplying the aminosilane-based silicon precursor P10 into the chamber.

Figure 2:
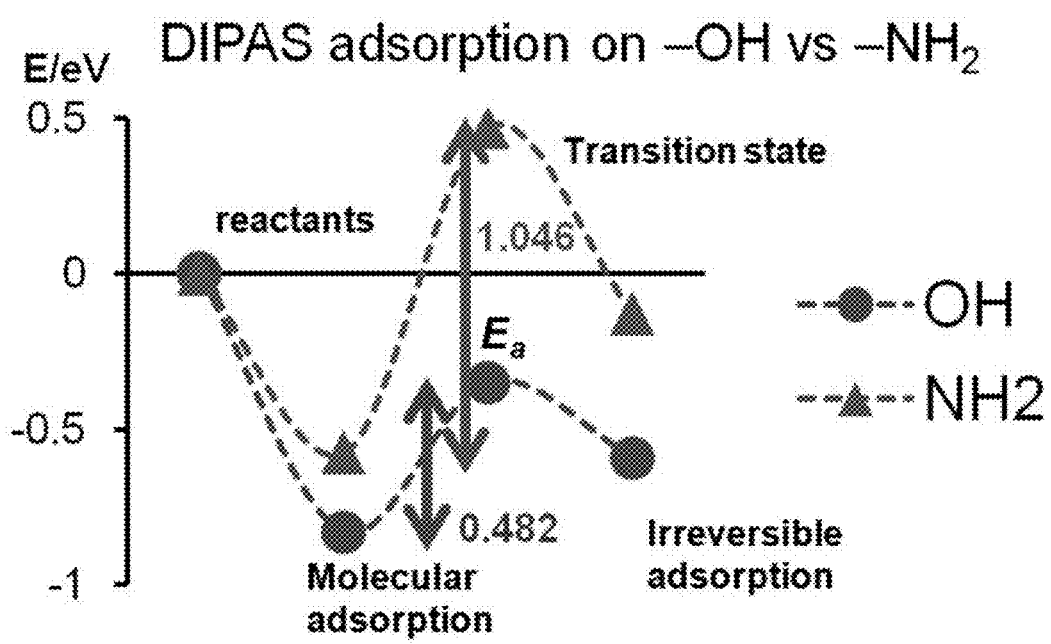
FIG. 2 is a graph showing the activation energy of DIPAS adsorption on —$NH_2$ and —OH.

The silicon precursor P10 may be an aminosilane-based precursor. As a specific example, the aminosilane-based silicon precursor P10 may be diisopropylamino silane (DIPAS). Since the activation energy of DIPAS for reaction with an —$NH_2$ functional group is at least twice as large as that for reaction with an —OH functional group, DIPAS may be selectively adsorbed to the —OH functional group among a —$NH_2$ functional group and the —OH functional group, while the adsorption of DIPAS to the —$NH_2$ functional group may be limited. FIG. 2 is a graph showing the activation energy of DIPAS adsorption on —$NH_2$ and —OH. As illustrated by FIG. 2, the activation energy (1.046 E/ev) of DIPAS for reaction with the —$NH_2$ functional group is more than two times larger than the activation energy (0.482 E/ev) for reaction with —OH functional group. Therefore, referring again to FIG. 1C, an ALD process, which is a low temperature deposition method, may be advantageous with respect to DIPAS in order to maximize selectivity due to the difference in activation energy between the —$NH_2$ and —OH functional groups. DIPAS may be selectively adsorbed onto the silicon oxide area 200 having —OH functional groups formed thereon, by the ALD process.

Figure 1D:
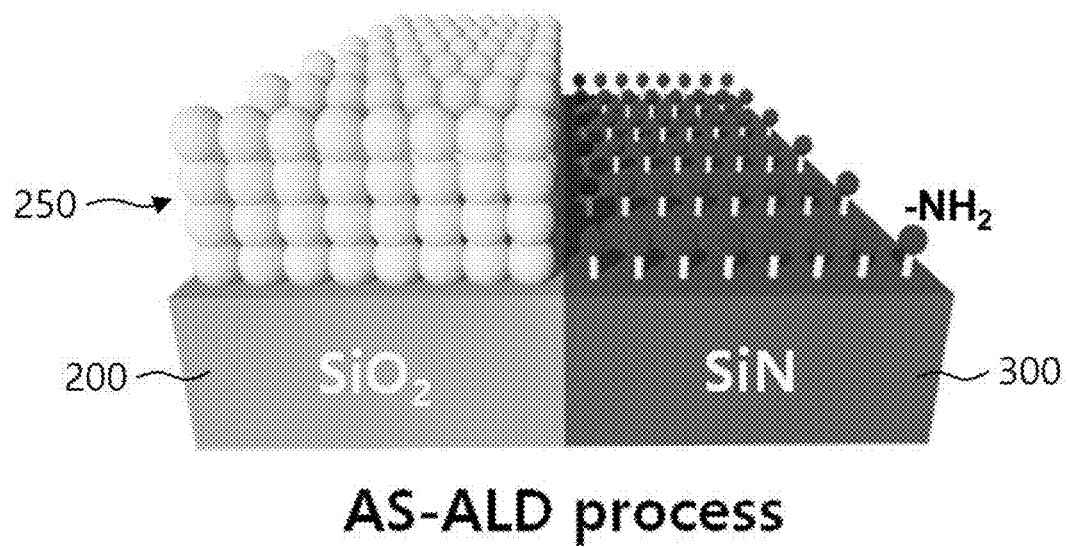

After the first supply step of supplying the silicon precursor P10, the first purge step, the second supply step, and the second purge step may be sequentially performed, and as a result, as shown in FIG. 1D, a silicon oxide layer 250 may be selectively formed on the silicon oxide area 200 among the silicon oxide area 200 and the silicon nitride area 300 in a layer-by-layer assembly process. As a result, according to an example of the present disclosure, an area-selective deposition (ASD) process can be implemented. A reaction inhibitor is not additionally applied to the silicon nitride area 300 other than the surface treatment, and thus the process according to the present example can be referred to as an inhibitor-less ASD process.

Figure 3A:
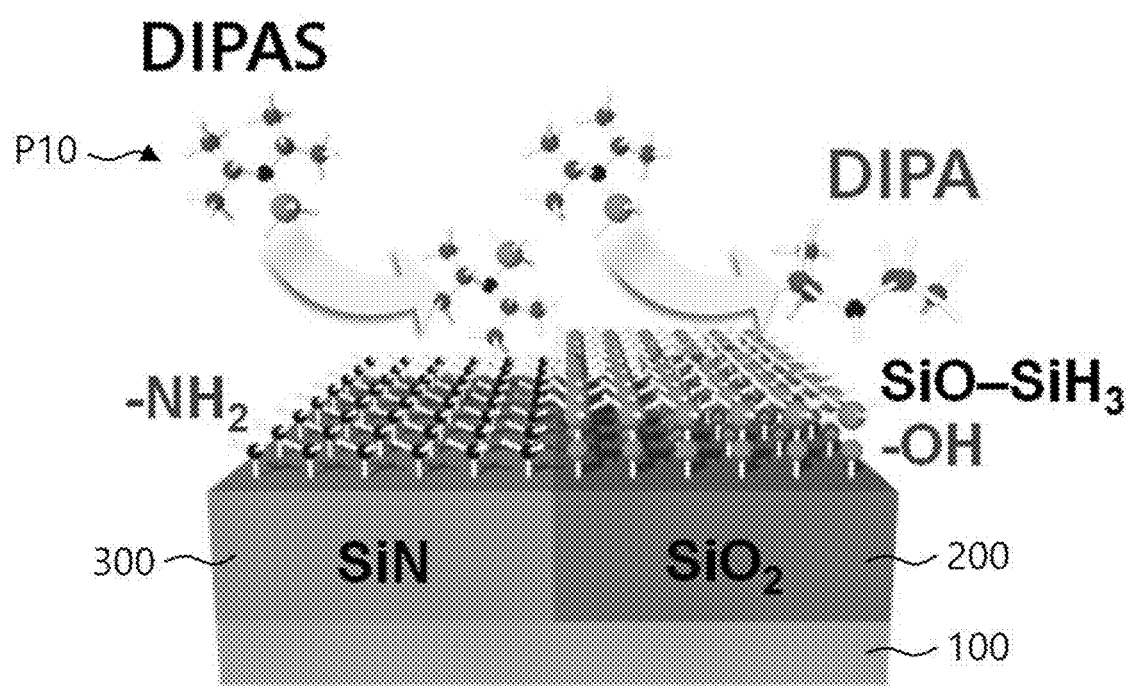
FIGS. 3A and 3B are diagrams illustrating an area-selective deposition method according to an example of the present disclosure in more detail.
Figure 3B:
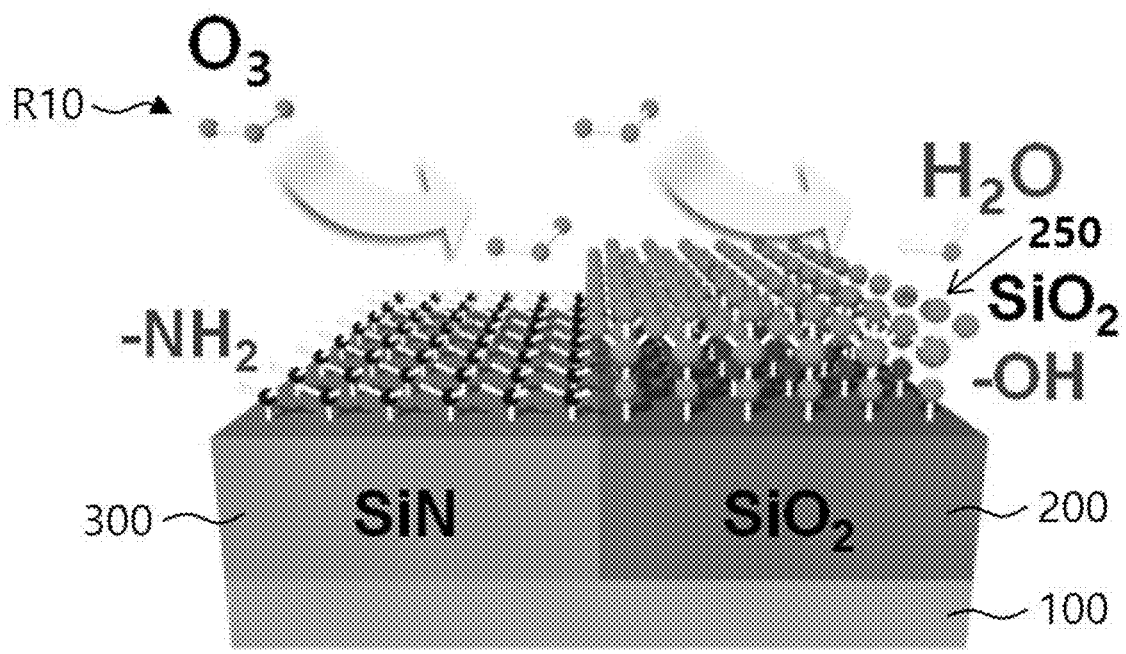

FIGS. 3A and 3B are diagrams illustrating an area-selective deposition method according to an example of the present disclosure in more detail.

FIG. 3A illustrates an example of the first supply step of the ALD process discussed above with reference to FIG. 1C. In the first supply step, silicon oxide area 200 and a silicon nitride area 300 may be provided on a substrate 100, and the surfaces of the silicon oxide area 200 and the silicon nitride area 300 may have a first functional group including —OH and a second functional group including —$NH_2$. The surface of the substrate may be treated with hydrofluoric acid to form the first and second functional groups. When an aminosilane-based silicon precursor P10 is supplied, the silicon precursor P10 may not be adsorbed onto the surface of the silicon nitride area 300, but may be selectively adsorbed onto a surface of the silicon oxide area 200. The silicon precursor P10 may be, for example, DIPAS, in which case the DIPAS may be chemically adsorbed to the surface of the silicon oxide area 200 to react with —OH and thus form —$SiH_3$, and diisopropylamine (DIPA) which is a byproduct of the reaction, may be removed as a gas. This reaction may be performed at a low temperature from room temperature to about 150° C.

FIG. 3B illustrates an example of the second supply step of the ALD process discussed above. An oxygen-containing source R10 supplied in the second supply step may include, for example, one of oxygen ($O_2$) and ozone ($O_3$), or a mixture of oxygen and ozone. The oxygen-containing source R10 may selectively react with —$SiH_3$ in the silicon oxide area 200 to form a silicon oxide layer 250 and, in the second purge step, $H_2O$ which is a byproduct of the reaction may be removed out of the chamber in the form of a gas. This reaction may be performed at a low temperature of about 150° C. or less.

The first supply step to the second purge step may be repeated at least one time to form the silicon oxide layer 250 having a predetermined thickness on the silicon oxide area 200.

In the area-selective deposition method according to the examples described with reference to FIGS. 1A to 1D and FIGS. 3A and 3B, the ALD process, including supplying a silicon precursor, performing a first purge, exposing the substrate to an oxygen-containing source, and performing a second purge may be performed at a process temperature of about 150° C. or less. Accordingly, in some examples, any of these processes may be performed at any of 150° C., 125° C., 100° C., 75° C., 50° C., or less, or at room temperature. When the processes are performed at 150° C. or less, each adsorption and reaction process for area-selective deposition according to the examples can be stably carried out.

The area-selective deposition method according to the examples described above may be applied to the fabrication of various types of electronic devices. For example, the area-selective deposition method according to the examples may be applicable to all electronic devices, such as NAND memory, dynamic random access memory (DRAM), transistors, and microelectromechanical systems (MEMS), which include functional thin films formable by vapor deposition.

Figure 4A:
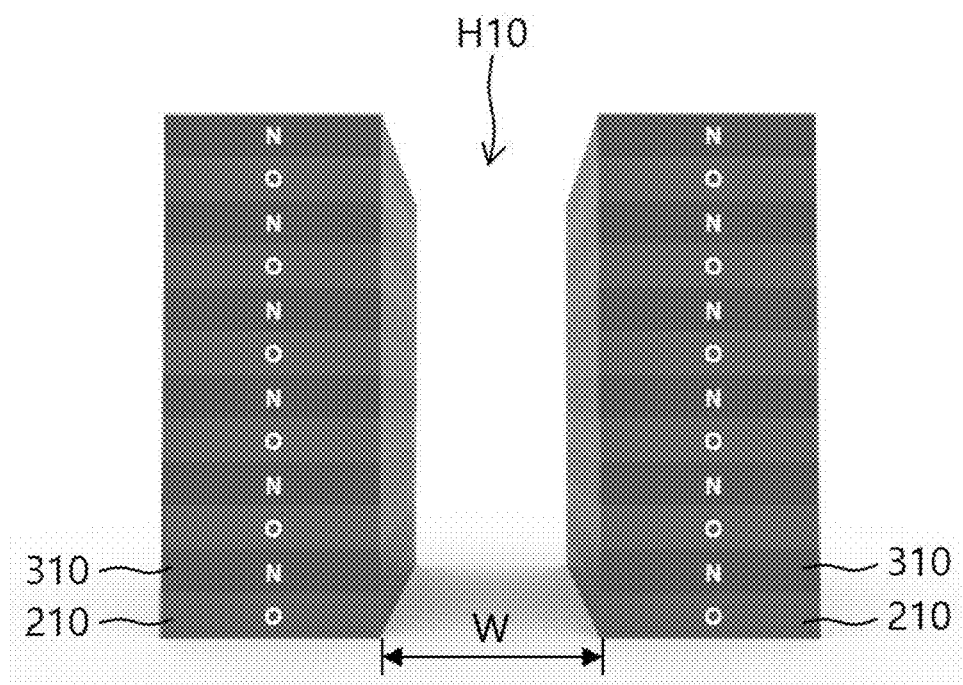
FIGS. 4A to 4C are perspective views illustrating an example in which an area-selective deposition method is applied to a three-dimensionally stacked structure, according to an example of the present disclosure.
Figure 4B:
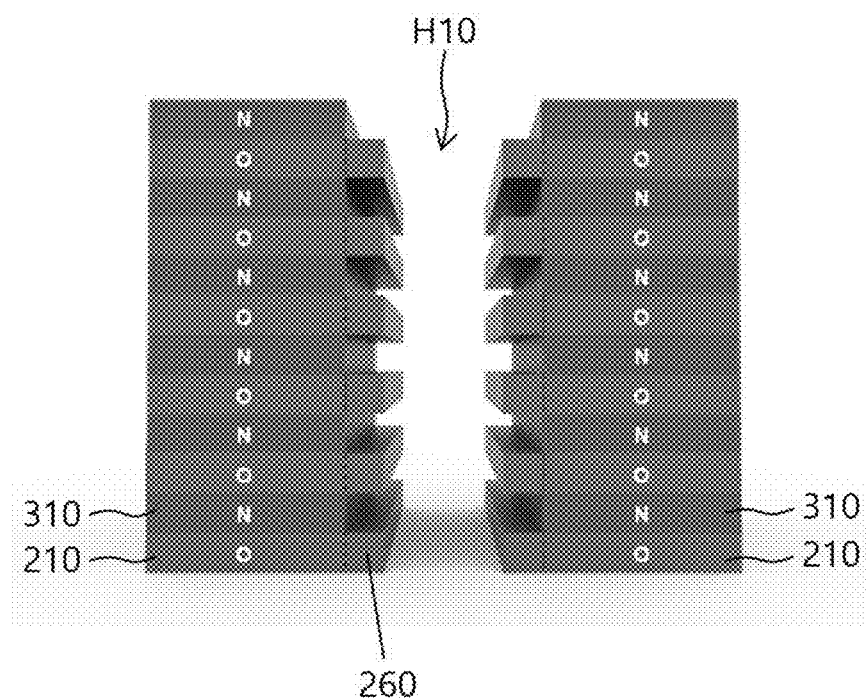
Figure 4C:
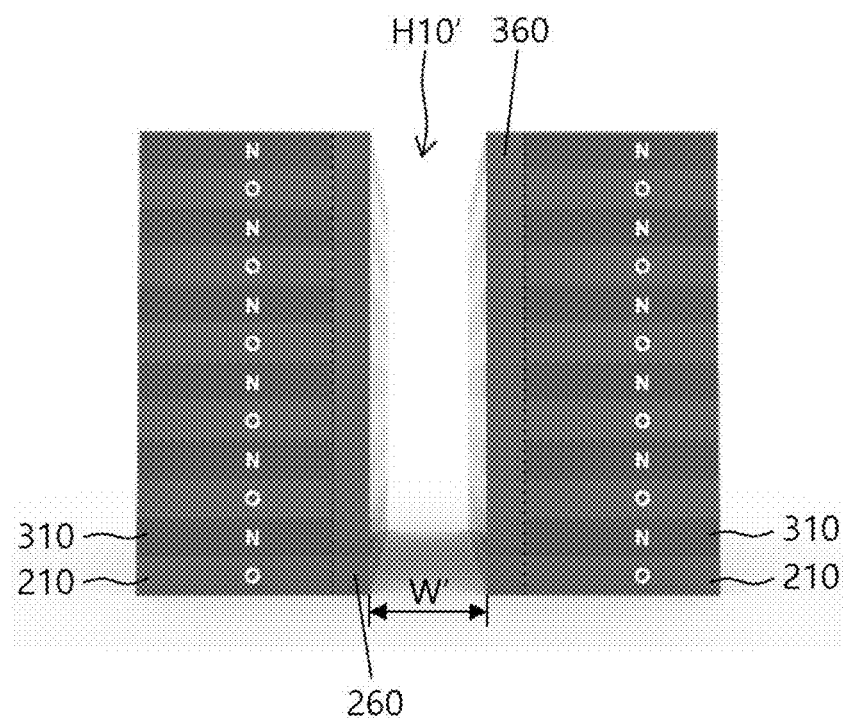

FIGS. 4A to 4C are perspective views illustrating an example in which an area-selective deposition method is applied to a three-dimensionally stacked structure, according to an example of the present disclosure.

Referring to FIG. 4A, a substrate structure may include a stack structure in which a plurality of silicon oxide thin film 210 and silicon nitride thin film 310 layers are alternately and repeatedly stacked on an upper surface of a substrate (not shown). The stack may have at least one opening area H10 formed in the direction in which the silicon oxide thin film 210 and the silicon nitride thin film 310 are stacked. Such a stack may be said to have a three-dimensionally laminated ONON stack structure, in which O denotes silicon oxide and N denotes silicon nitride. A three-dimensional stack as illustrated in FIG. 4A may be applied, for example, to the fabrication of NAND strings constituting a cell array of a three-dimensional V-NAND device. As a non-limiting example, the three-dimensional stack may be applied to a process of selectively removing silicon nitride (N) by selectively etching the silicon nitride, and filling an area where the silicon nitride (N) is removed with a metal for word lines to form a word line stack. A channel semiconductor pillar and an information storage film surrounding the semiconductor pillar may be formed in the opening or hole H10, which may be a circular space when viewed from above. However, the present disclosure is not limited to the shape of a circle, and the opening area H10 may be a trench elongated in a direction parallel to a primary surface of the substrate.

Referring to FIG. 4B, a silicon oxide layer 260 may be selectively formed on a side surface of the silicon oxide thin film 210 exposed to the inner surface of the opening area H10 by using an area-selective deposition method according to an example of the present disclosure using DIPAS as described above.

Referring to FIG. 4C, after the silicon oxide layer 260 is formed, a silicon nitride layer 360 may be selectively formed on a side surface of the silicon nitride thin film 310 among the silicon oxide thin film 210 and the silicon nitride thin film 310, that is, the side surface exposed by the opening area H10. The silicon nitride layer 360 may be formed using, as a non-limiting example, an atomic layer deposition process using known precursors suitable for forming a silicon nitride.

FIG. 4C illustrates a stack structure in which the silicon oxide thin film 210 and the silicon nitride thin film 310 are alternately and repeatedly stacked, the final width W' of the opening area H10 formed by area-selective deposition is smaller than the initial width W of the opening area H10 shown in FIG. 4A by twice of the thickness of the silicon oxide layer 260 and the silicon nitride layer 360 laterally grown by area-selective deposition. The widths W and W' may be the diameter of a vertical through hole or the width of a trench which is formed in the stack structure. According to an example of the present disclosure, an ultra-fine through hole or a gap between structures with a high aspect ratio can be obtained by down-top processing using an ALD process capable of conformal layer deposition and nano-level thickness control according to a layer-by-layer stacking mechanism, rather than an etching process.

Figure 5:
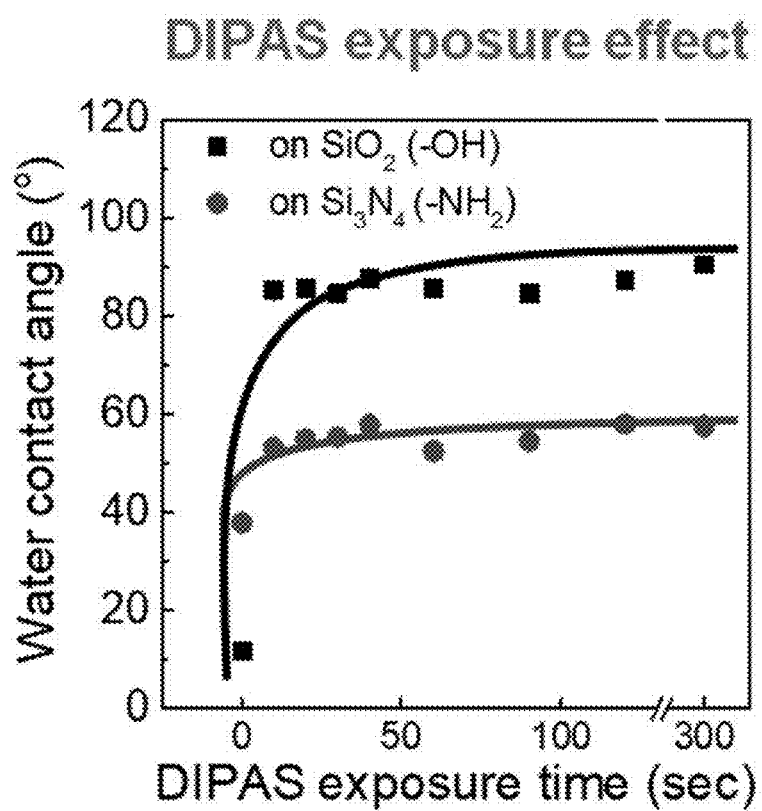
FIG. 5 is a graph showing a change in a water contact angle according to DIPAS exposure time to confirm the effect of DIPAS exposure on a silicon oxide ($SiO_2$) with —OH functional groups on the surface and a silicon nitride ($Si_3N_4$) with —$NH_2$ functional groups on the surface.

FIG. 5 is a graph showing changes in water contact angle according to DIPAS exposure time to show the effects of DIPAS exposure on a silicon oxide ($SiO_2$) having —OH functional groups on the surface thereof and a silicon nitride ($Si_3N_4$) having —$NH_2$ functional groups on the surface thereof.

Referring to FIG. 5, when a silicon oxide ($SiO_2$) surface having an —OH functional group is exposed to DIPAS, the water contact angle substantially increased up to a level of about 90°. The increased contact angle is evidence that DIPAS is adsorbed onto the surface of the silicon oxide ($SiO_2$), which changes its surface characteristics.

When silicon nitride ($Si_3N_4$) surface having an —$NH_2$ functional group thereon is exposed to DIPAS, the water contact angle increases by about 50° to 60°. The increase in contact angle is not because DIPAS is adsorbed onto the surface of the silicon nitride ($Si_3N_4$), but rather is an effect caused by thermal treatment on the substrate. This change in contact angle by thermal treatment can be seen in the graph of FIG. 6.

Figure 6:
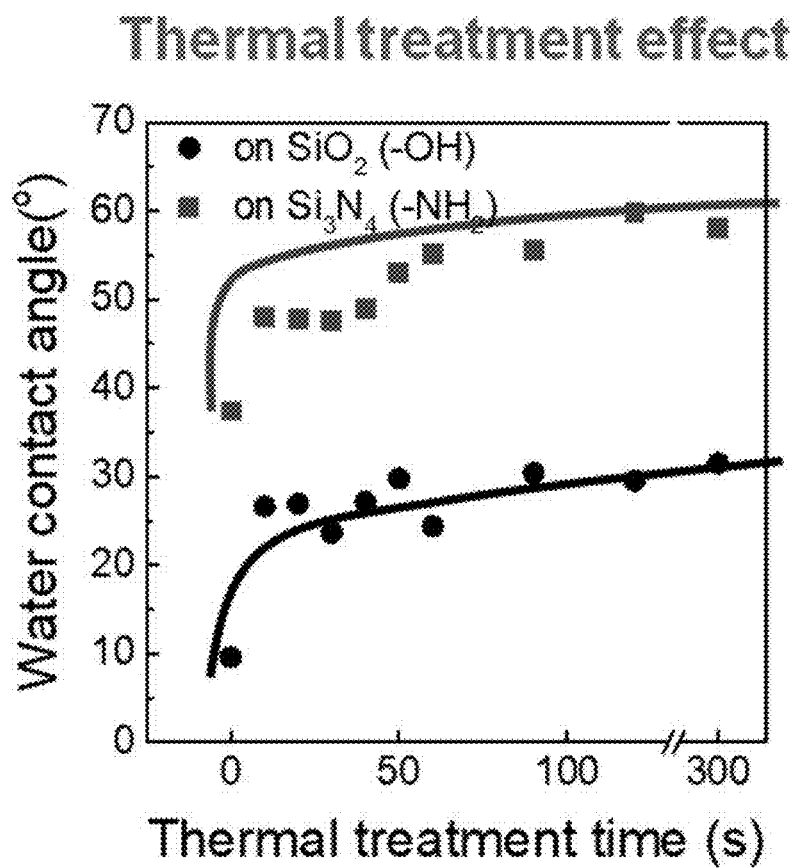
FIG. 6 is a graph showing a change in a water contact angle according to thermal treatment time of silicon oxide ($SiO_2$) with —OH functional groups on the surface and silicon nitride ($Si_3N_4$) with —$NH_2$ functional groups on the surface.

FIG. 6 is a graph showing a change in a water contact angle according to thermal treatment time of a silicon oxide ($SiO_2$) surface having —OH functional groups on the surface thereof and a silicon nitride ($Si_3N_4$) surface having —$NH_2$ functional groups on the surface thereof. The temperature of the thermal treatment in FIG. 6 corresponds to the thermal treatment temperature used in the experiment of FIG. 5.

Referring to FIG. 6, when a silicon nitride surface ($Si_3N_4$) having an —$NH_2$ functional group is subjected to a thermal treatment, the water contact angle increases to about 50° to 60° with thermal treatment time. The extent of this change is similar to the extent by which the water contact angle of the silicon nitride ($Si_3N_4$) is changed in FIG. 5. Therefore, it can be determined that the change in the water contact angle of the silicon nitride ($Si_3N_4$) in FIG. 5 is caused by thermal treatment, and not caused by the adsorption of DIPAS on the surface of the silicon nitride. On the other hand, in the case of a silicon oxide ($SiO_2$) having an —OH functional group, considering that the water contact angle reached only about 20° to 30° with the increase in the thermal treatment time, and the water contact angle of the silicon oxide exposed to DIPAS changed greatly up to about 90°, such a rapid change supports the conclusion that DIPAS is adsorbed onto the surface of the silicon oxide ($SiO_2$). Consequently, from the results of FIGS. 5 and 6, it can be concluded that when DIPAS is exposed to a silicon oxide ($SiO_2$) surface having an —OH functional group and a silicon nitride surface ($Si_3N_4$) having an —$NH_2$ functional group, the DIPAS is selectively adsorbed onto and reacts with the silicon oxide ($SiO_2$), which changes the surface characteristics of the silicon oxide.

Figure 7:
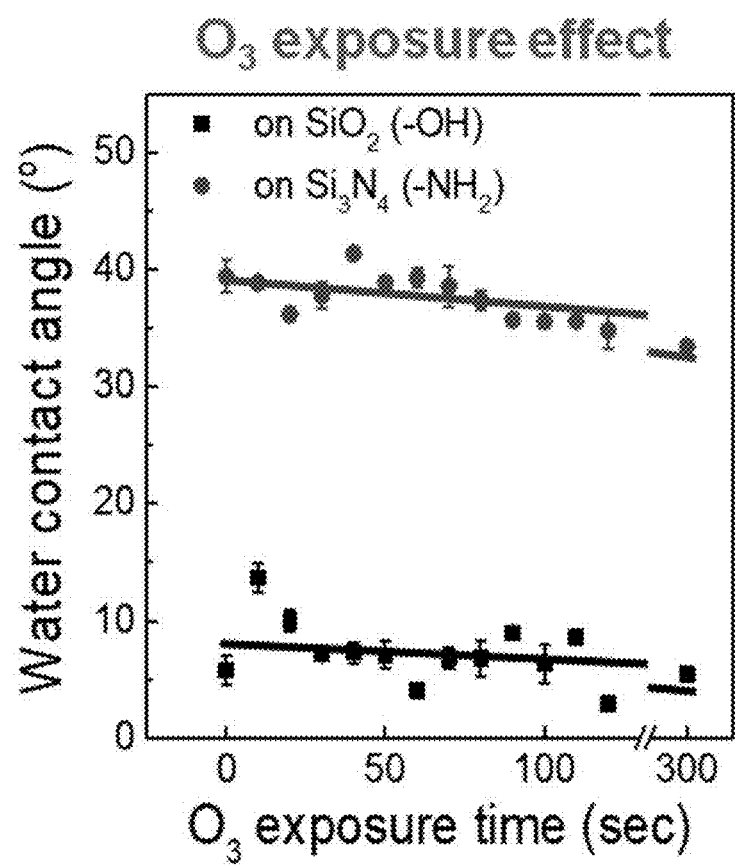
FIG. 7 is a graph showing a change in a water contact angle according to ozone ($O_3$) exposure time to confirm the effect of ozone ($O_3$) exposure on a silicon oxide ($SiO_2$) with —OH functional groups on the surface and a silicon nitride ($Si_3N_4$) with —$NH_2$ functional groups on the surface.

FIG. 7 is a graph showing a change in a water contact angle according to ozone ($O_3$) exposure time to confirm the effect of ozone ($O_3$) exposure on silicon oxide ($SiO_2$) having —OH functional groups on the surface thereof and silicon nitride ($Si_3N_4$) having —$NH_2$ functional groups on the surface thereof.

Referring to FIG. 7, when a silicon oxide ($SiO_2$) surface having —OH functional groups was exposed to ozone ($O_3$), the water contact angle decreased slightly in a range of less than about 10°. In particular, as indicated by the trendline, the absolute change in contact angle was a reduction of about 8° to about 4°, which is a reduction of about 4°. This result shows that, even if the silicon oxide ($SiO_2$) surface having —OH functional groups is exposed to ozone ($O_3$), there is very little change in surface characteristics caused by the ozone ($O_3$).

Contrary to the above results for silicon oxide, when a silicon nitride surface ($Si_3N_4$) having —$NH_2$ functional groups was exposed to ozone ($O_3$), the water contact angle decreased slightly in a range lower than about 40°. As indicated by the trendline, the absolute change in contact angle was a reduction of about 40° to about 32°, or a reduction of about 8°. This result indicates that, when the silicon nitride ($Si_3N_4$) having —$NH_2$ functional groups is exposed to ozone ($O_3$), the ozone ($O_3$) exposure may cause more degradation of the —$NH_2$ functional groups than the —OH functional groups.

Figure 8:
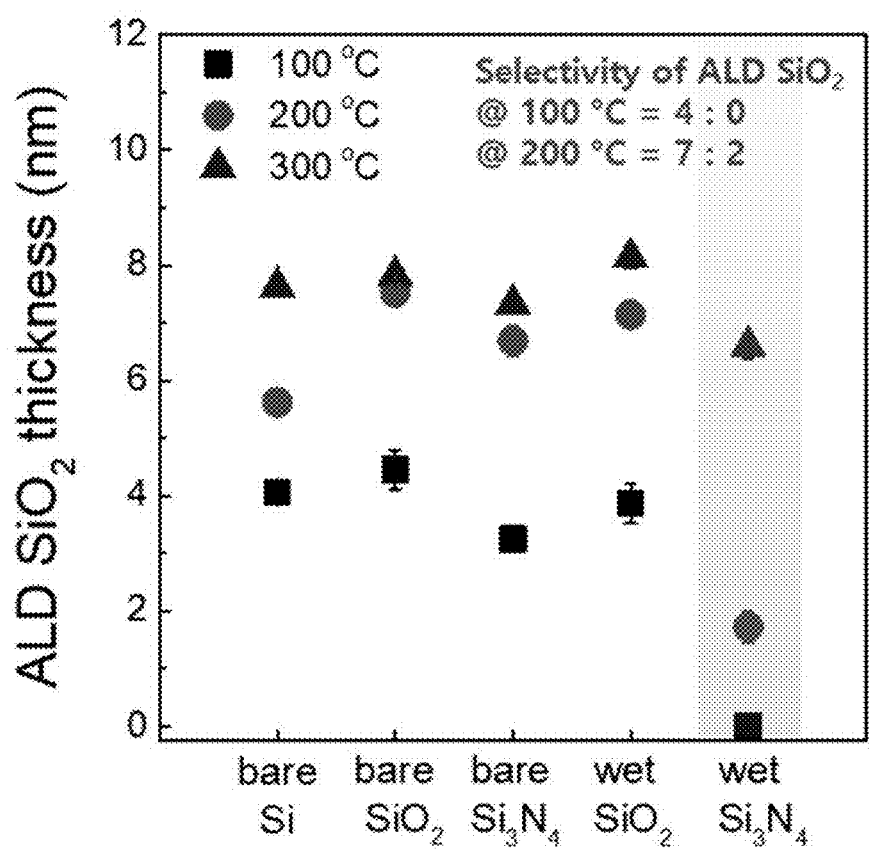
FIG. 8 is a graph showing a change in the thickness of $SiO_2$ deposited by an area-selective deposition method using DIPAS depending on deposition temperature and whether or not surface treatment is performed on a silicon oxide ($SiO_2$) and a silicon nitride ($Si_3N_4$), according to an example of the present disclosure.

FIG. 8 is a graph showing changes in thickness of ALD $SiO_2$ deposited using an area-selective deposition method in accordance with deposition temperature conditions, and whether or not surface treatment is performed on silicon oxide ($SiO_2$) and silicon nitride ($Si_3N_4$) by using DIPAS according to an example of the present disclosure. In FIG. 8, the term "bare" indicates that no surface treatment is performed, and the term "wet" indicates that a surface treatment with an HF solution is performed. The deposition temperatures for the ALD process were 100° C., 200° C., and 300° C.

Referring to FIG. 8, under a deposition temperature condition of 100° C., 4 nm thick $SiO_2$ was deposited by an ALD process on the surface-treated wet $SiO_2$, and no ALD $SiO_2$ was deposited on the surface-treated wet $Si_3N_4$. Thus, in this case, the selectivity of ALD $SiO_2$ deposited by an area-selective deposition method according to one example of the present disclosure is 4:0, which is theoretically an infinite selectivity ratio.

In addition, FIG. 8 illustrates that at a deposition temperature condition of 200° C., a 7 nm thick layer of ALD $SiO_2$ was deposited on the surface-treated wet $SiO_2$, and a 2 nm thick layer of ALD $SiO_2$ was deposited on the surface-treated wet $Si_3N_4$. Accordingly, in this case, the selectivity of ALD $SiO_2$ deposited by an area-selective deposition method according to an example of the present disclosure may be 7:2.

Figure 9:
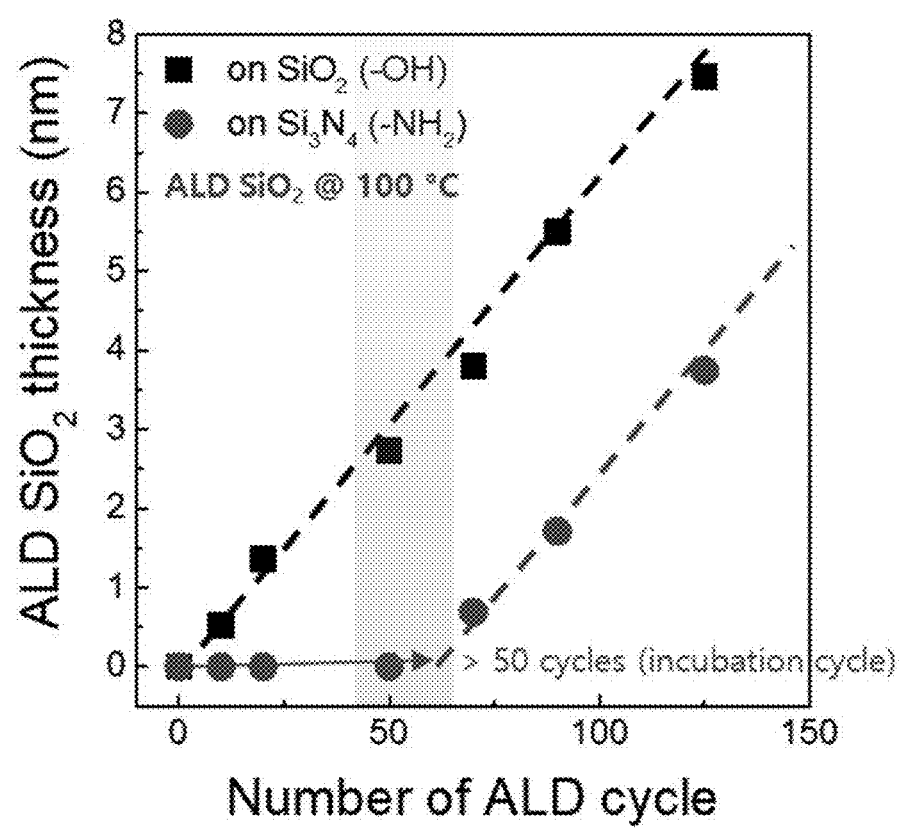
FIG. 9 is a graph showing a change in the thickness of the deposited $SiO_2$ according to an increase in the number of cycles of an ALD process in which the $SiO_2$ is deposited on a surface-treated silicon oxide ($SiO_2$) and silicon nitride ($Si_3N_4$) at a deposition temperature of 100° C., according to an example of the present disclosure.

FIG. 9 is a graph showing a change in the thickness of deposited ALD $SiO_2$ in accordance with an increase in the number of ALD cycles while $SiO_2$ is deposited on a surface-treated silicon oxide ($SiO_2$) and silicon nitride ($Si_3N_4$) under a deposition temperature condition of 100° C. by an ALD process, according to an example of the present disclosure. The ALD cycle applied to the substrates of FIG. 9 includes performing the steps of silicon precursor supply, first purge, oxygen-containing source supply, and second purge discussed above, and the change in the thickness of deposited ALD $SiO_2$ was measured while repeating this cycle.

Referring to FIG. 9, the thickness of ALD $SiO_2$ deposited on the surface-treated silicon oxide ($SiO_2$) increased in proportion to the number of ALD cycles as the number of the cycles increased. In contrast, ALD $SiO_2$ was not deposited on the surface-treated silicon nitride ($Si_3N_4$) up to about the 50th cycle, but the thickness of deposited ALD $SiO_2$, was found to increase in proportion to the number of cycles after 50 cycles. These results show that little or no ALD $SiO_2$ is deposited on the surface-treated silicon nitride ($Si_3N_4$) up to about the 50th cycle. In the present disclosure, an initial set of cycles where ALD $SiO_2$ is not deposited on a silicon nitride ($Si_3N_4$) surface may be referred to "incubation cycles".

Figure 10:
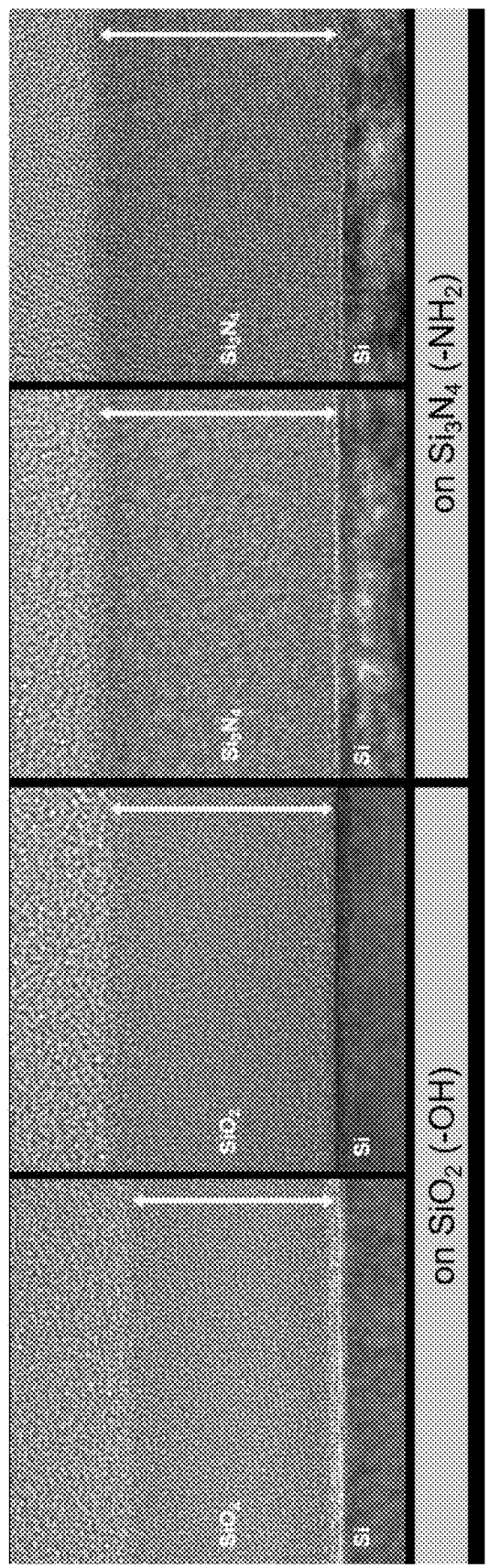
FIG. 10 is a cross-sectional image of a scanning electron microscope showing $SiO_2$ and $Si_3N_4$ layers before deposition (left) and after the 50th cycle (right) of the ALD process of FIG. 9.

FIG. 10 includes electron microscope images (cross-sectional images) showing ALD $SiO_2$ deposition results corresponding to the 0th cycle and the 50th cycle of FIG. 9. In FIG. 10, the image on the left side of the $SiO_2$ images shows the substrate before deposition, i.e., a photograph corresponding to the 0th cycle, and the image on the right side of the $SiO_2$ images shows the result of the deposition of ALD $SiO_2$ after the 50th deposition cycle. Similarly, the photograph on the left side of the $Si_3N_4$ images shows the state of a $Si_3N_4$ surface before deposition, and the photograph on the right side of the figure shows the state of a $Si_3N_4$ surface after performing 50 ALD cycles.

Referring to FIG. 10, about 4 nm of ALD $SiO_2$ was deposited on the surface-treated silicon oxide ($SiO_2$) after the 50th cycle, and a visible amount ALD $SiO_2$ was not deposited on the surface-treated silicon nitride ($Si_3N_4$) at the 50th cycle.

Figure 11A:
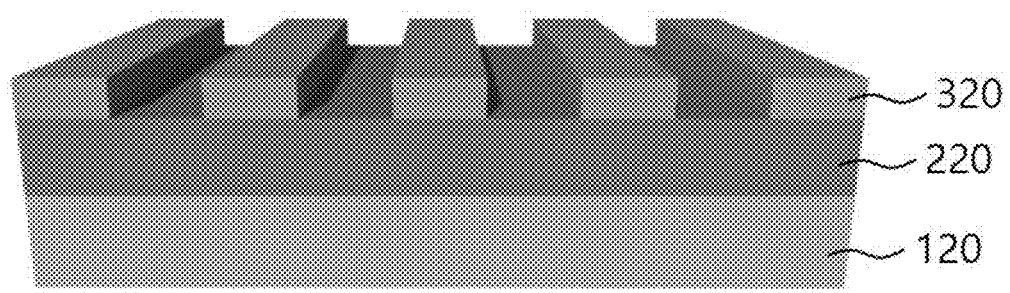
FIGS. 11A to 11C are perspective views illustrating an area-selective deposition method according to another example of the present disclosure.
Figure 11B:
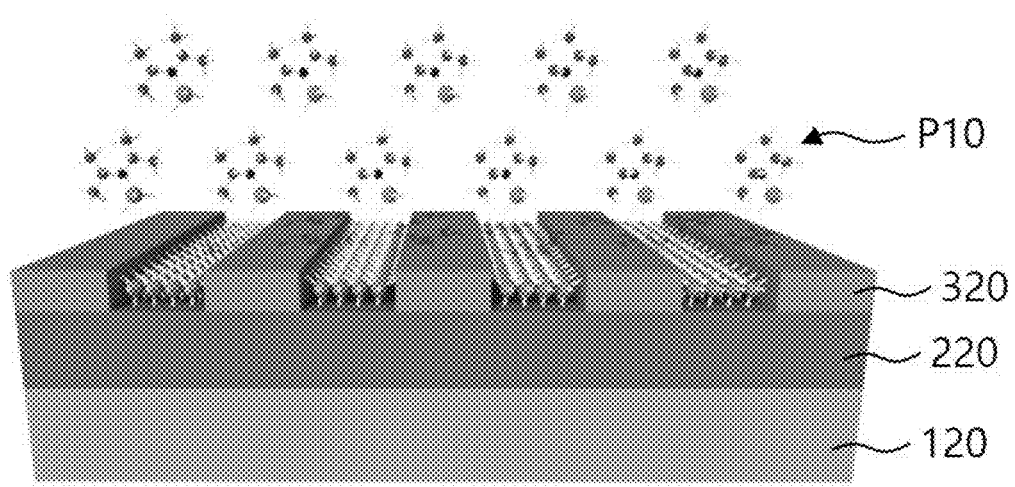
Figure 11C:
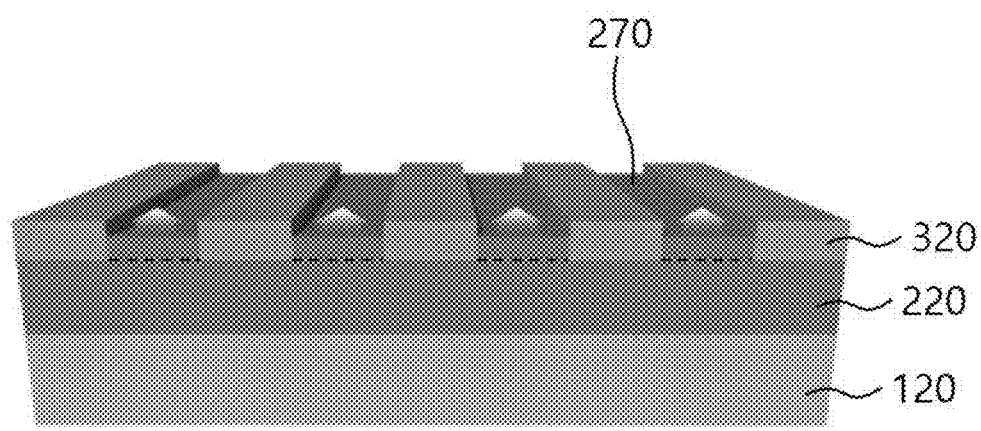

FIGS. 11A to 11C are perspective views illustrating an area-selective deposition method according to another example of the present disclosure.

Referring to FIG. 11A, a silicon oxide film 220 may be provided on a substrate 120, and a plurality of silicon nitride pattern films 320 spaced apart from each other may be arranged on the silicon oxide film 220. An area of the silicon oxide film 220 may be exposed between the plurality of silicon nitride pattern films 320. Thus, in this case, at least one area of exposed silicon oxide and at least one area of exposed silicon nitride are provided on the upper surface of the substrate 120 in a direction parallel to the substrate 120.

Referring to FIG. 11B, after a surface treatment (e.g., a surface treatment using an HF solution) is performed on the surfaces of the plurality of silicon nitride pattern films 320, and the surfaces of the areas of the silicon oxide film 220 exposed between the plurality of silicon nitride pattern films, an area-selective deposition process may be performed according to an example of the present disclosure. This ALD process may be the same as or similar to the ALD process discussed above with respect to FIGS. 1A-1D, etc. Reference numeral P10 in FIG. 11B denotes an aminosilane-based silicon precursor.

As a result of the area-selective deposition process, as shown in FIG. 11C, a silicon oxide layer 270 may be selectively formed in a bottom-up manner on the areas of the silicon oxide film 220, which are exposed between the plurality of silicon nitride pattern films 320.

According to another example of the present disclosure, the silicon oxide layer is formed by an ALD process, and the ALD process may include a repeated deposition step of repeatedly performing a first supply step of supplying an aminosilane-based silicon precursor, a first purge step, a second supply step of supplying an oxygen-containing source, and a second purge step.

Furthermore, according to the example described above, an area-selective deposition method may further include an etching step of performing an etching process on the silicon oxide area and the silicon nitride area after the repeated deposition step. In addition, the area-selective deposition method may include a super-cycle process of alternately repeating the repeated deposition step and the etching step. This super-cycle process can increase the selectivity of ALD $SiO_2$ deposition. This will be described in more detail with reference to FIG. 12.

Figure 12:
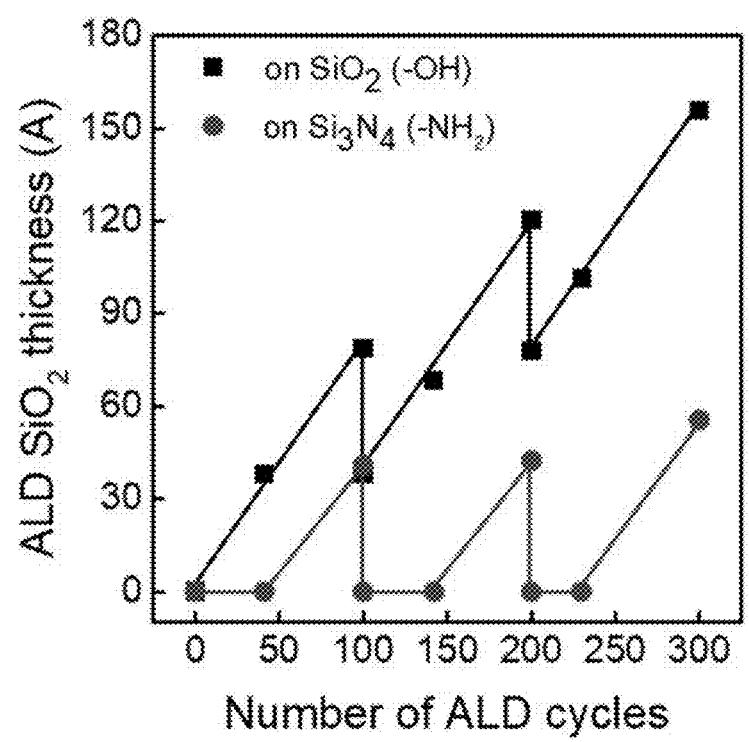
FIG. 12 is a graph showing a change in the thickness of the deposed $SiO_2$ according to the number of the cycles of the ALD process in a super-cycle process according to another example of the present disclosure.

FIG. 12 is a graph showing a change in the thickness of deposited ALD $SiO_2$ according to the number of ALD cycles in a super-cycle process according to another example of the present disclosure.

With reference to FIG. 12, the repeated depositing step and the etching step are alternately repeated so that the repeated deposition step is performed about 100 times, and after the repeated deposition steps, the etching step is performed. An ALD $SiO_2$ thin film formed on the silicon nitride ($Si_3N_4$) at the latter part of the repeated deposition step may be removed by the etching step. When the ALD $SiO_2$ thin film formed on the silicon nitride ($Si_3N_4$) is removed through the etching step, the thickness of ALD $SiO_2$ thin film formed on the silicon oxide ($SiO_2$) may also be partially removed. However, a result of such a super-cycle process shows that it is possible to form greater thicknesses of ALD $SiO_2$ thin film on a silicon oxide surface without accumulating $SiO_2$ thin film on a silicon nitride surface than would otherwise be possible using only the repeated depositing step. For example, the film thickness in the example of FIG. 12 increases to at least about 8 nm or at least about 10 nm after performing several super cycles. However, the thickness achieved by the subject of FIG. 12 is merely an example and will be further increased as the super-cycle are repeated. Accordingly, processes of the present disclosure can be used to form greater film thicknesses than 10 nm by performing multiple super cycles.

Figure 13:
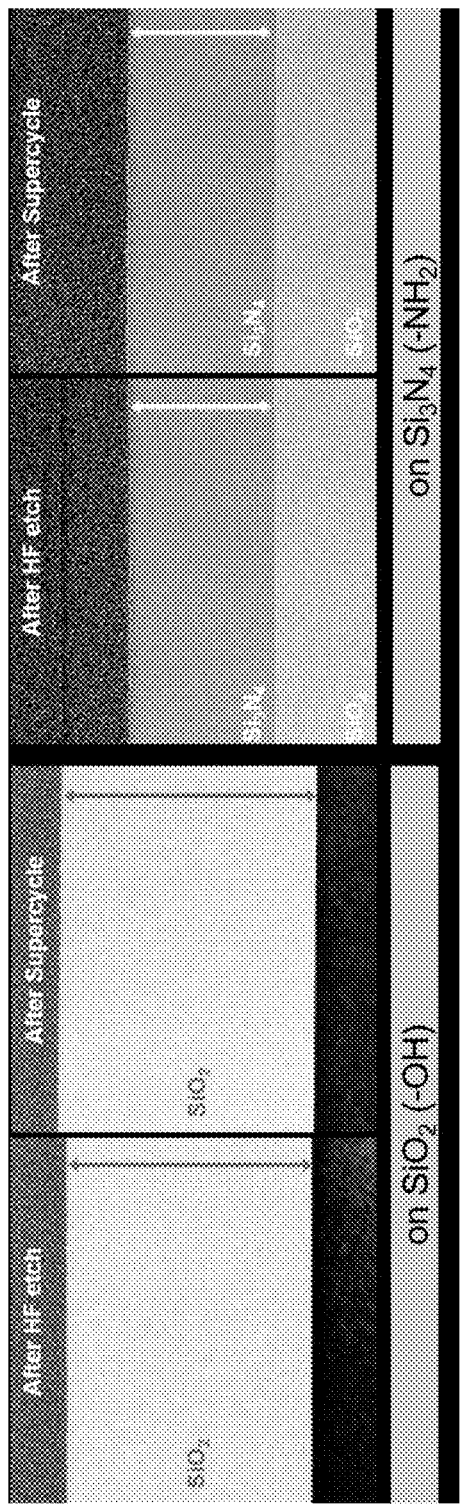
FIG. 13 is a cross-sectional image of a scanning electron microscope showing the thickness of a $SiO_2$ thin film deposited by an ALD process on a silicon oxide ($SiO_2$) and silicon nitride ($Si_3N_4$) before (left) and after (right) being surface-treated by a super-cycle process according to an example of the present disclosure.

FIG. 13 illustrates electron microscope images (cross-sectional images) showing the thickness of an ALD $SiO_2$ thin film formed on a surface-treated silicon oxide ($SiO_2$) and silicon nitride ($Si_3N_4$) by a super-cycle process according to an example of the present disclosure.

Referring to FIG. 13, an ALD $SiO_2$ thin film was formed on the surface-treated silicon oxide ($SiO_2$) by the above-described super-cycle process, but no ALD $SiO_2$ thin film was formed on the surface-treated silicon nitride ($Si_3N_4$). This means that the thickness of ALD $SiO_2$ deposition is increased to about 10 nm by the super-cycle process without accumulating ALD $SiO_2$ thin film on the silicon nitride.

Figure 14:
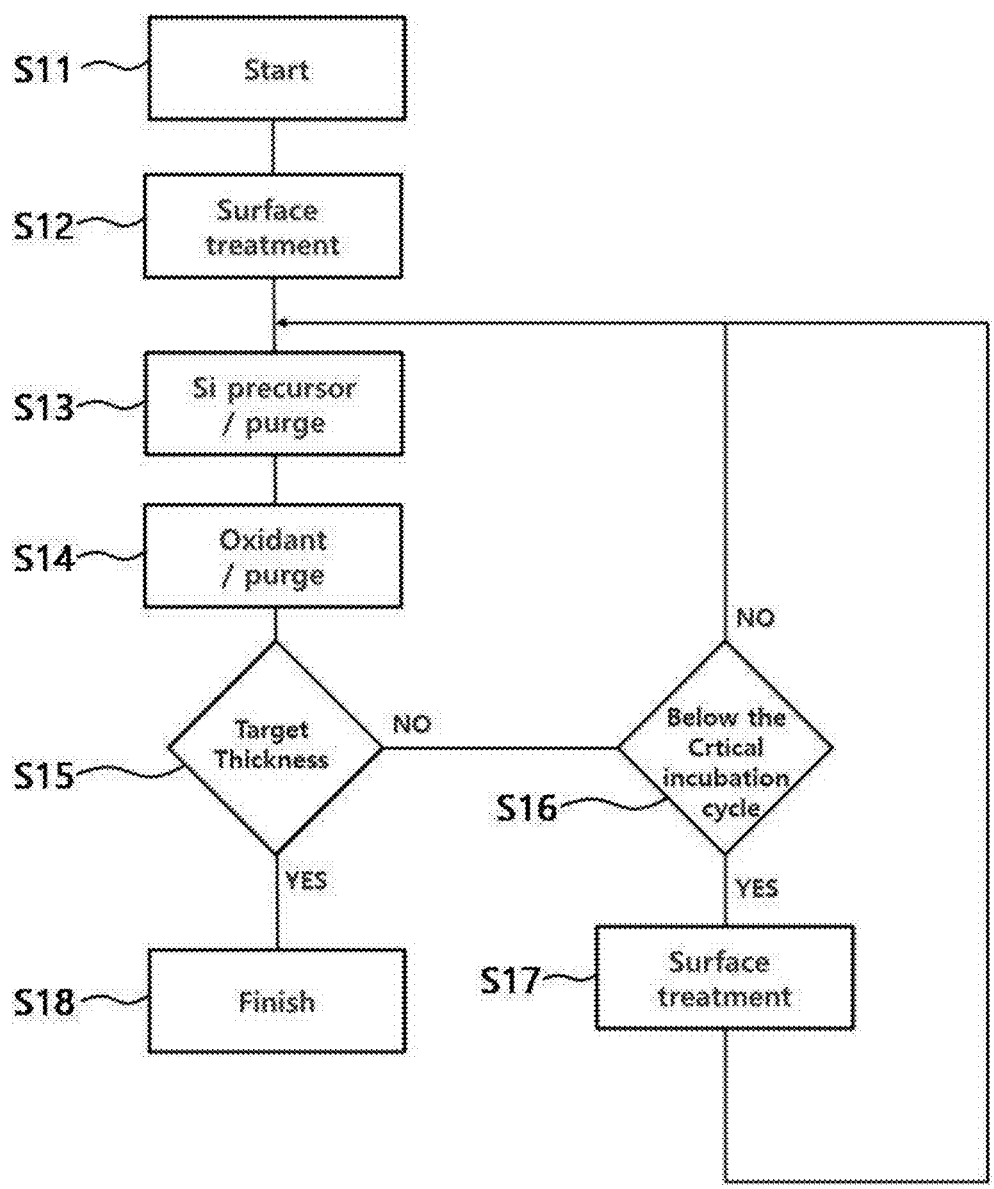
FIG. 14 is a flowchart illustrating an area-selective deposition method according to an example of the present disclosure.

FIG. 14 is a flowchart illustrating an area-selective deposition method according to an example of the present disclosure.

Referring to FIG. 14, in a first step S11, a substrate structure including a silicon oxide area and a silicon nitride area may be provided. The first step S11 may be the step in which a deposition process is initiated.

In a second step S12, a surface treatment may be performed on the silicon oxide area and the silicon nitride area of the substrate structure to form a first functional group on the surface of the silicon oxide area and a second functional group on the surface of the silicon nitride area. The surface treatment may be performed, for example, with a solution containing hydrogen fluoride (HF). The first functional group formed on the surface of the silicon oxide area by the surface treatment may be —OH or may include —OH, and the second functional group formed on the surface of the silicon nitride area may be —$NH_2$ or may include —$NH_2$. However, the surface treatment is not limited to a wet chemical treatment using the hydrogen fluoride (HF) solution described above, and may be varied. In another example, the surface treatment may be performed by a dry process containing fluorine (F), and in some examples, the dry process may be carried out by a plasma treatment using at least one of $N_2$, $NH_3$, $N_2H_4$, $H_2$, or a mixed gas of two or more thereof, together with or in replacement of fluorine. In yet another example, the surface treatment may be performed by a thermal process in a plasma processing gas using at least any one of $N_2$, $NH_3$, $N_2H_4$, $H_2$, or a mixed gas of two or more thereof, together with or in replacement of fluorine.

In a third step S13, a first supply step of supplying an aminosilane-based silicon precursor into a chamber in which the substrate structure is disposed, and a first purge step of purging the chamber with a first purge gas may be sequentially performed. Here, the aminosilane-based silicon precursor may include, for example, DIPAS.

In a fourth step S14, a second supply step of supplying an oxygen-containing source as an oxidant into the chamber and a second purge step of purging the chamber with a second purge gas may be sequentially performed. The oxygen-containing source may include, for example, ozone ($O_3$).

The combination of the third step S13 and the fourth step S14 may constitute an ALD process, by which a silicon oxide layer can be selectively formed on the silicon oxide area among the silicon nitride area and the silicon oxide area. The processing temperature of the ALD process may be about 150° C. or less. For example, the processing temperature of the ALD process may be about 90° C.~150° C.

After the fourth step S14, a fifth step S15 of determining whether the silicon oxide layer has reached a target thickness may be performed. If it is determined in the fifth step S15 that the target thickness has not been reached, whether the cycle of the ALD process has reached a critical incubation cycle may be determined in a sixth step S16. Here, the critical incubation cycle refers to a cycle at which a certain thickness of $SiO_2$ thin film (e.g. 4 nm) is formed on the silicon nitride. If the cycle of the ALD process has not reached the critical incubation cycle in the sixth step S16, steps S13 to S15 may be repeated until the critical incubation cycle is reached. If it is determined in the sixth step S16 that the cycle of the ALD process has reached the critical incubation cycle, a step of surface-treating the surfaces of the silicon oxide area and the silicon nitride area may be performed as a seventh step S17. Here, the surface treatment may be the same as that in step S12, whereby the surface portions of the silicon oxide area and the silicon nitride area may be reset to have the same surface activation status as they had immediately after step S12. Thereafter, steps S13 to S15 may be repeated again.

If it is determined in the fifth step S15 that the thickness of the silicon oxide layer has reached the target thickness, the area-selective deposition process may be ended at S18. However, the sequence of the area-selective deposition process described with reference to FIG. 14 is merely exemplary and may be altered in different embodiments.

Figure 15A:
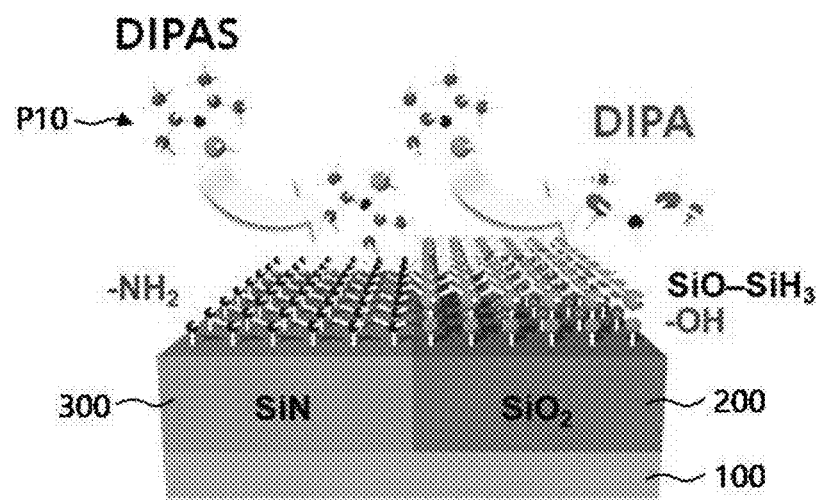
FIGS. 15A to 15C are perspective views illustrating an area-selective deposition method according to another example of the present disclosure.
Figure 15B:
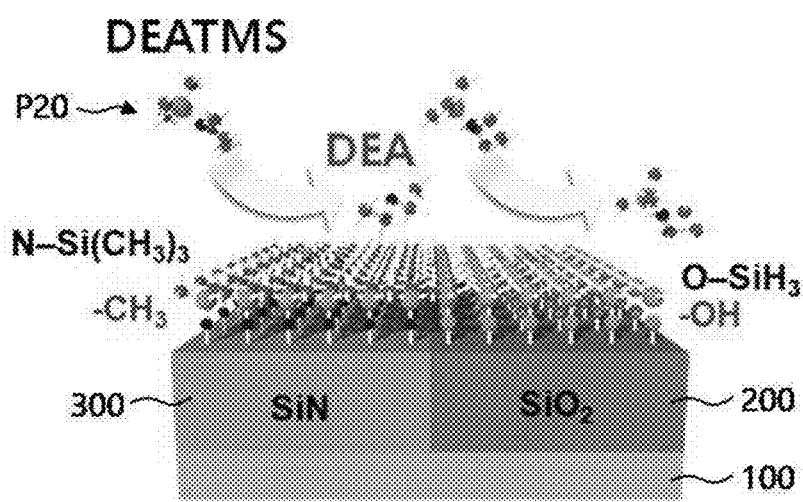
Figure 15C:
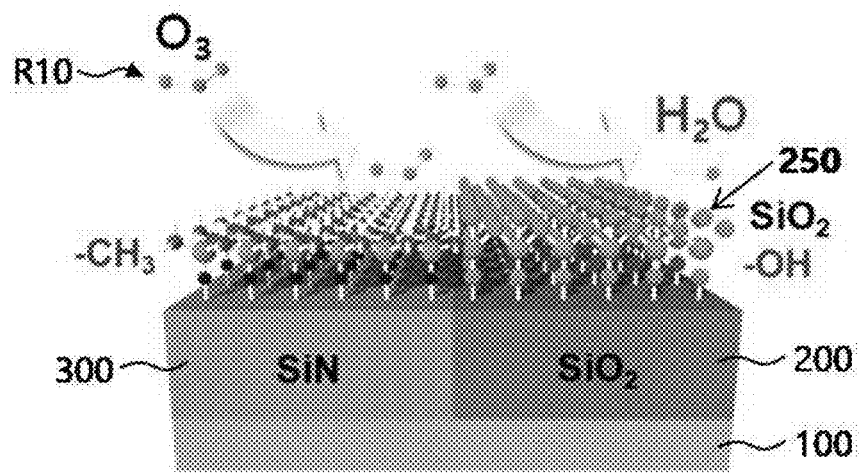

FIGS. 15A to 15C are perspective views illustrating an area-selective deposition method according to another example of the present disclosure. This example relates to the introduction of a reaction inhibitor to an area-selective deposition method. In the area-selective deposition method according to an example of the present disclosure, the ALD process may further include a step of introducing a reaction inhibitor selectively on the silicon nitride area among the silicon oxide area and the silicon nitride area. The step of introducing the reaction inhibitor may include, between the first purge step and the second supply step, a third supply step of feeding an inhibitor precursor material into the chamber and a third purge step of purging the chamber with a third purge gas.

FIG. 15A may correspond to the step of FIG. 3A, which is the first supply step of the ALD process. Referring to FIG. 15A, a silicon oxide area 200 and a silicon nitride area 300 may be provided on a substrate 100, wherein the surfaces of the silicon oxide area 200 and the silicon nitride area 300 may have —OH functional groups (the first functional groups) and —$NH_2$ functional groups (second functional groups) by a surface treatment. When an aminosilane-based silicon precursor P10 is supplied, the silicon precursor P10 is not adsorbed onto the surface of the silicon nitride area 300, but may be selectively adsorbed on the surface of the silicon oxide area 200. The silicon precursor P10 may be, for example, DIPAS, the DIPAS may be adsorbed onto the surface of the silicon oxide area 200 to react with —OH to form —$SiH_3$, and diisopropylamine (DIPA), which is a byproduct of the reaction, may be removed in the form of a gas. This reaction may be relatively stably carried out at a low temperature of about 150° C. or less. Although not shown, after the first supply step, a first purge step may be performed.

Referring to FIG. 15B, after the first purge step, a third supply step of supplying an inhibitor precursor material P20 into the chamber may be performed. The inhibitor precursor material P20 may be, for example, N,N-diethylamino trimethylsilane (DEATMS). When DEATMS is supplied, the DEATMS may be selectively adsorbed onto the silicon nitride area 300 among the silicon oxide area 200 and the silicon nitride area 300, and may react with —$NH_2$ functional groups to form $Si(CH_3)_3$. Diethylamine (DEA), which is a byproduct of the reaction, may be removed in the form of a gas. This reaction by DEATMS may take place, for example, in a temperature range of between about 100 and 300° C. The inhibitor precursor material P20, such as DEATMS, may be selectively adsorbed onto the silicon nitride area 300 and, then, react with the silicon nitride area 300 to function to inhibit a deposition process (film formation reaction) at the surface of the silicon nitride area 300 in a subsequent ALD process (i.e., an inhibitor role). Therefore, the application of the inhibitor precursor material P20 can further increase the selectivity of an area-selective deposition process according to an example of the present disclosure. Although not shown, after the third supply step, a third purge step of purging the chamber with a third purge gas may be performed.

The step in FIG. 15C may be a step similar to the "second supply step" described above with reference to FIG. 3B. Referring to FIG. 15C, an oxygen-containing source R10 supplied in the second supply step may include, for example, ozone ($O_3$). The oxygen-containing source R10 may selectively react with —$SiH_3$ of the silicon oxide area 200 to form a silicon oxide layer 250, and $H_2O$ as a byproduct of the reaction may be removed in the form of a gas. This reaction can be carried out relatively stably at a low temperature of about 150° C. or less. $Si(CH_3)_3$ is formed on the surface of the silicon nitride area 300, and thus film deposition (i.e., ALD $SiO_2$ film deposition) on the silicon oxide area 300 can be further suppressed. Therefore, the application of an inhibitor precursor material (the material P20 in FIG. 15B) can further increase the selectivity of an area-selective deposition process according to an example.

For consistency, the supply step in FIG. 15B may be referred to as a third supply step, the purge step may be referred to as a third purge step, the supply step in FIG. 15C are referred to as a second supply step, and the purge step is referred to as a second purge step. However, in this example, it can be understood that the third supply step may be performed before the second supply step in a time sequence, and the third purge step may be also performed before the second purge step.

The third supply step and the third purge step may be performed only once in the initial stage of the ALD process and may not be performed during or after the second cycle. On the other hand, in the case of a super-cycle process, when the surface portions of the silicon oxide area and the silicon nitride area are etched and re-activated by an etching process, the third supply step and the third purge step may be additionally performed at an initial stage of the ALD process after the etching.

Figure 16:
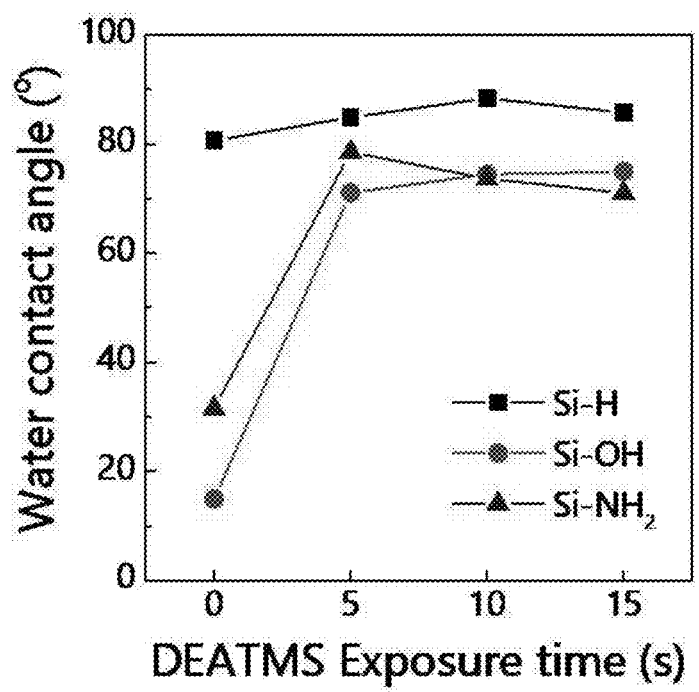
FIG. 16 is a graph showing the results of measurement of a change in a water contact angle according to an increase of DEATMS exposure time for various surfaces.

FIG. 16 is a graph showing the results of measurement of a change in a water contact angle according to an increase of DEATMS exposure time for various surfaces.

Referring to FIG. 16, even if the Si—H surface is exposed to DEATMS, the water contact angle may be hardly changed, which means that DEATMS may be adsorbed onto Si—H surface but does not react with the Si—H surface. When the exposure time of DEATMS on the Si—OH and Si—$NH_2$ surfaces is increased, the water contact angle changes greatly, which can mean that DEATMS is adsorbed well to the Si—OH surface and the Si—NH$_2$ surface. Therefore, in the step of FIG. 15B, DEATMS can be well adsorbed onto the surface of the silicon nitride area 300 rather than that of the silicon oxide area 200.

Figure 17:
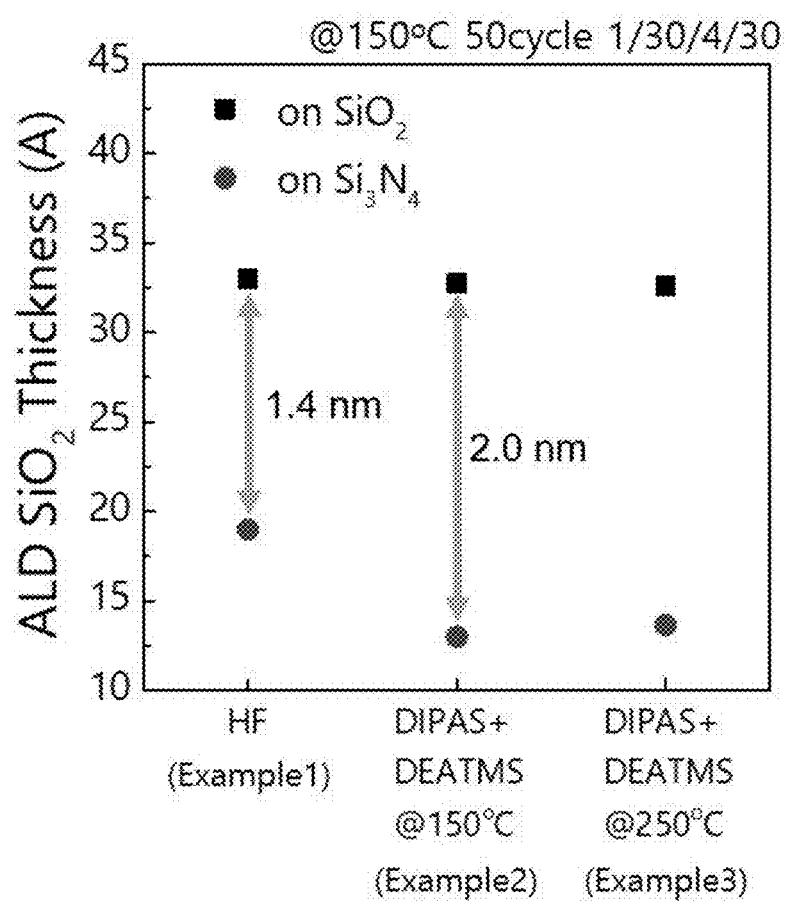
FIG. 17 is a graph showing a change in the selectivity of $SiO_2$ thin film deposition according to application of a reaction inhibitor in an area-selective deposition process according to an example.

FIG. 17 is a graph showing a change in the selectivity of ALD SiO$_2$ thin film deposition according to an application of a reaction inhibitor in an area-selective deposition process according to an example. FIG. 17 includes the results of Example 1, Example 2 and Example 3. Example 1 is a case where, after a surface treatment with a HF solution, an ALD process is performed by utilizing a DIPAS/purge/O$_3$/purge cycle. Example 2 is a case where, after a surface treatment with HF solution, the DIPAS/purge/DEATMS/purge/O$_3$/purge steps are performed, and then an ALD process is performed according to a DIPAS/purge/O$_3$/purge cycle. The processing temperature during the supply of DEATMS was 150° C. Example 3 is a case where, after a surface treatment with a HF solution, the DIPAS/purge/DEATMS/purge/O$_3$/purge steps are performed, and then an ALD process is performed by utilizing a DIPAS/purge/O$_3$/purge cycle. The processing temperature during the supply of DEATMS in Example 3 was 250° C. DEATMS was applied as a reaction inhibitor.

Referring to FIG. 17, for Example 1 without using DEATMS, the amount of ALD SiO$_2$ thin film deposited on a silicon oxide was about 1.4 nm greater than silicon nitride, and for Examples 2 and 3 using DEATMS, the amount of ALD SiO$_2$ thin film deposited on the silicon oxide was about 2.0 nm greater than silicon nitride. These results demonstrate that, when DEATMS is applied as a reaction inhibitor, deposition of an ALD SiO$_2$ thin film on a silicon nitride is further suppressed, and the selectivity increases.

Figure 18:
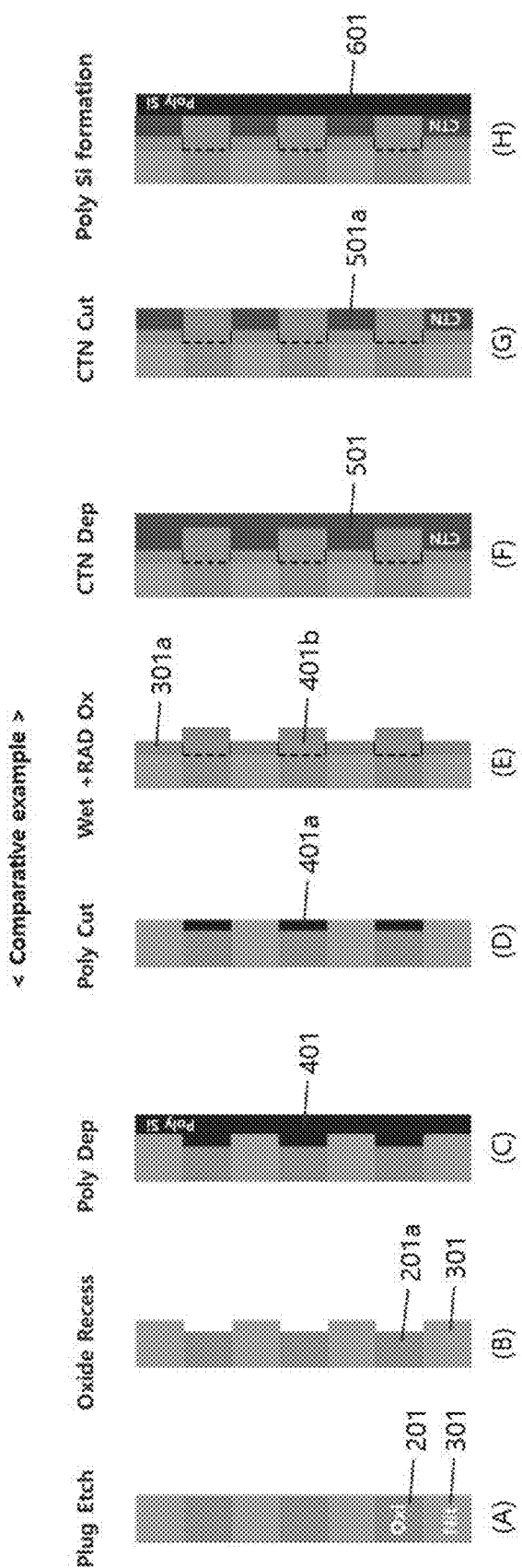
FIG. 18 is a cross-sectional view showing an example of an integrated process according to a comparative example which may be part of a V-NAND device fabrication process according to a conventional process.

FIG. 18 is a cross-sectional view showing an integrated process according to a comparative example. The comparative example of FIG. 18 may be part of a conventional V-NAND device fabrication process.

Referring to FIG. 18, in step (A), a stack structure in which a silicon nitride thin film 301 and a silicon oxide thin film 201 are alternately and repeatedly stacked may be provided. A predetermined opening area, for example, a hole may be formed in a part of the stack structure. In this figure, for the sake of convenience, only a stack portion disposed at one side of the opening area is shown.

In step (B), the silicon oxide thin film 201 may be partially recessed in the opening area. Reference numeral 201a denotes a silicon oxide thin film that is partially recessed relative to nitride thin film 301.

In step (C), a polysilicon layer 401 may be formed on the silicon oxide thin film 201a and the silicon nitride thin film 301 in the opening area.

In step (D), the polysilicon layer 401 may be partially etched so that the polysilicon layer 401 remains only in recess areas corresponding to silicon oxide thin films 201a. The remaining polysilicon layer is designated by reference numeral 401a.

In step (E), a wet oxidation process and a radical oxidation process may be performed. In the wet oxidation process, the polysilicon layer 401a may be oxidized, and the nitride 301 may not be oxidized. Here, an oxide (hereinafter, referred to as a first oxide) obtained by oxidation of the polysilicon layer 401a is denoted by reference numeral 401b. Part of the nitride 301 may be oxidized by the radical oxidation process. Here, an oxide (hereinafter, referred to as a second oxide) obtained by oxidation of the nitride 301 is denoted by reference numeral 301a.

In step (F), a charge trap nitride (CTN) thin film 501 may be formed. The CTN thin film 501 may be formed on the first oxide 401b and the second oxide 301a.

In step (G), a part of the CTN thin film 501 may be etched, so that multiple CTN pattern films 501a remain between and around multiple first oxides 401b.

In step (H), a polysilicon layer 601 may be formed on the multiple first oxides 401b and the multiple CTN pattern films 501a.

A V-NAND device fabrication process according to the conventional process (comparative example) described with reference to FIG. 18 may be complicated and inefficient.

Figure 19:
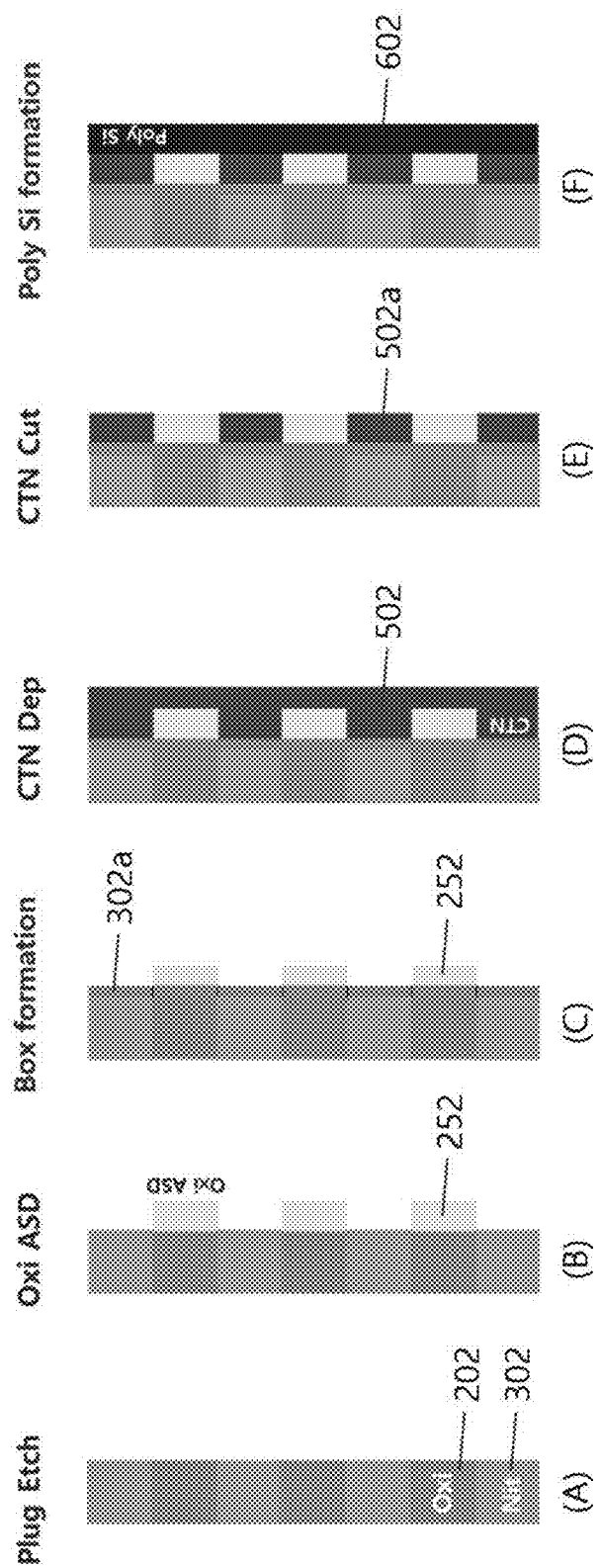
FIG. 19 is a cross-sectional view showing an example of an integrated process based on an area-selective deposition process according to an example of the present disclosure.

FIG. 19 is a cross-sectional view showing an example of an integrated process to which an area-selective deposition process according to an example of the present disclosure is applied. The example of FIG. 19 may be part of a V-NAND device manufacturing process.

Referring to FIG. 19, in step (A), a stack structure in which a silicon nitride thin film 302 and a silicon oxide thin film 202 are alternately and repeatedly stacked may be provided. A predetermined opening area, for example, a hole may be formed in a part of the stack. In this figure, for the sake of convenience, only a stack portion disposed at one side of the opening area is shown.

In step (B), a silicon oxide layer 252 may be formed on a side surface of each of silicon oxide thin films 202 in the opening area by using an area-selective deposition process according to an example of the present disclosure.

In step (C), blocking oxide layers 302a may be formed on both sides of the silicon oxide layer 252.

In step (D), a CTN thin film 502 entirely covering silicon oxide layers 252 and the blocking oxide layers 302a may be formed in the opening area.

In step (E), a part of the CTN thin film 502 may be etched, so that a plurality of CTN pattern films 502a remain between and around the plurality of silicon oxide layers 252.

In step (F), a polysilicon layer 602 may be formed on the plurality of silicon oxide layers 252 and the plurality of the CTN pattern films 502a. The resulting product of the step (F) may have a structure similar to that of step (H) in the comparative example of FIG. 18.

The integrated process according to the example described with reference to FIG. 19 is simple and has an increased efficiency, compared to the integrated process according to the comparative example of FIG. 18.

Figure 20:
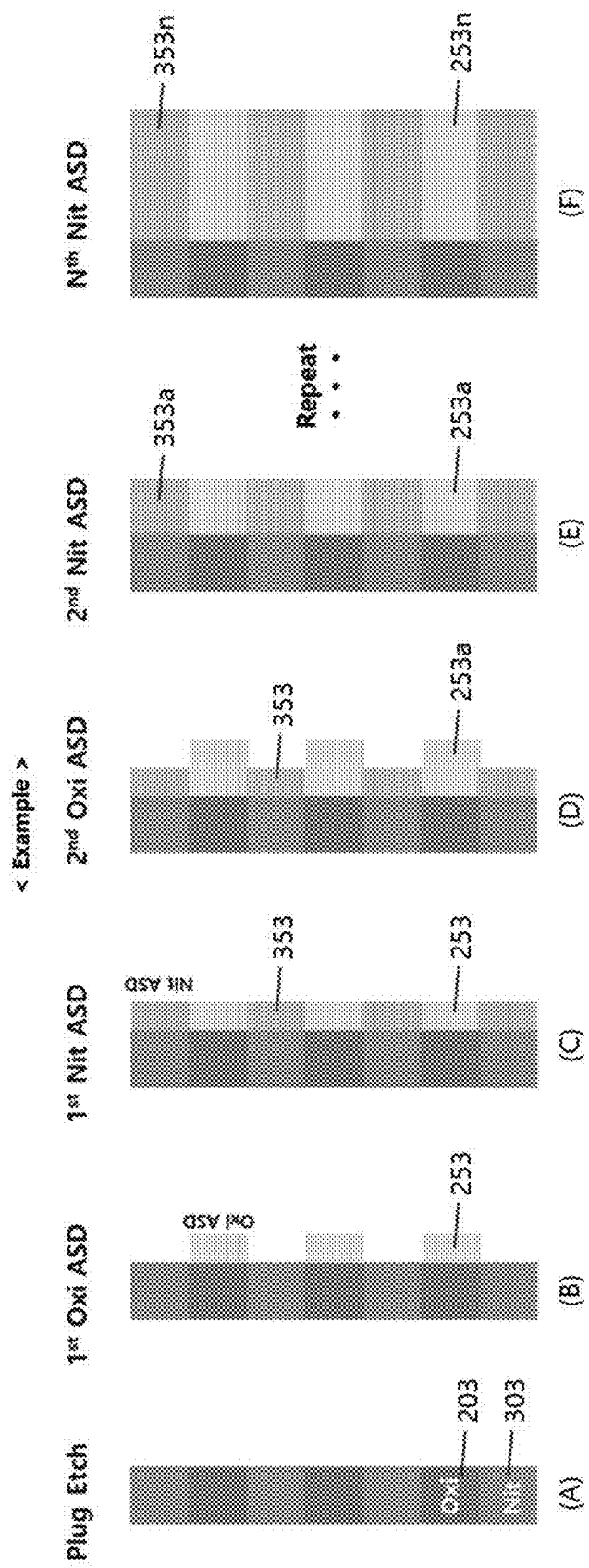
FIG. 20 is a cross-sectional view showing an example of a device fabrication process using an area-selective deposition process according to another example of the present disclosure.

FIG. 20 is a cross-sectional view showing an example of a device forming process to which an area-selective deposition process is applied, according to another example of the present disclosure.

Referring to FIG. 20, in step (A), a stack structure in which a silicon nitride thin film 303 and a silicon oxide thin film 203 are alternately and repeatedly stacked may be provided. A predetermined opening area, for example, a hole may be formed in a part of the stack structure. In this figure, for the sake of convenience, only a stack portion disposed at one side of the opening area is shown.

In step (B), a first silicon oxide layer 253 may be formed on a side surface of the silicon oxide thin film 203 in the opening area by using an area-selective deposition process according to an example of the present disclosure. This may be referred to as a first oxide ASD process.

In step (C), a first silicon nitride layer 353 may be formed on a side surface of the silicon nitride thin film 303 in the opening area by using a conventional selective deposition process. This may be referred to as a first nitride ASD process.

In step (D), a second silicon oxide layer may be formed on a side surface of the first silicon oxide layer 253 by using an area-selective deposition process according to an example of the present disclosure. The first silicon oxide layer 253 and the second silicon oxide layer are collectively shown as one layer 253a, which is referred to as a secondary silicon oxide layer 253a. The process of step (D) may be referred to as a second oxide ASD process.

In step (E), a second silicon nitride layer may be formed on a side surface of the first silicon nitride layer 353 in the opening area by using a conventional area-selective deposition process. The first silicon nitride layer 353 and the second silicon nitride layer are collectively shown as one layer 353a, which is referred to as a secondary silicon nitride layer 353a. The process of step (E) may be referred to as a second nitride ASD process.

As in steps (B) to (E), the oxide ASD process and the nitride ASD process may be alternately repeated. Step (F) shows the result of repeating the oxide ASD process and the nitride ASD process up to an N-th order. Here, reference numeral 253n denotes an N-th order silicon oxide layer, and reference numeral 353n denotes an N-th order silicon nitride layer.

Figure 21:
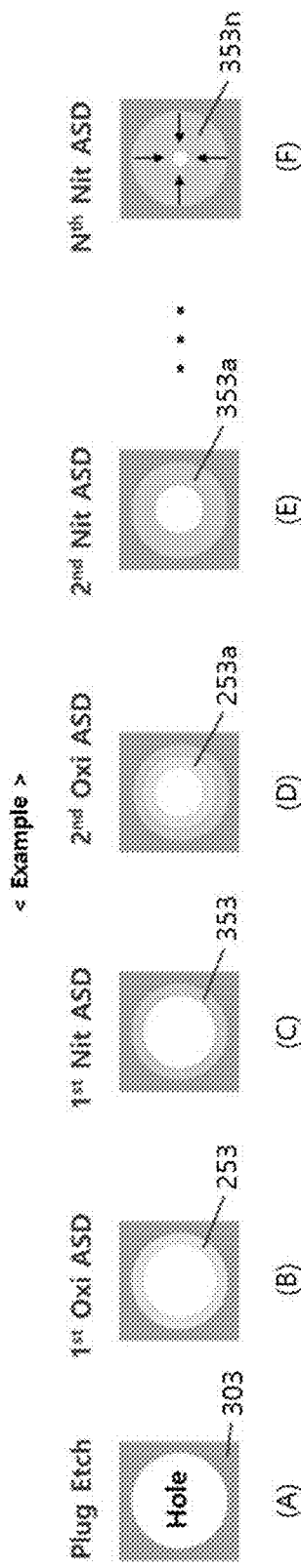
FIG. 21 shows a plan or top view of the process steps of FIG. 20.

FIG. 21 shows a plan view (i.e., a top view) of the process steps of FIG. 20. The respective steps of FIG. 21 may correspond to the respective steps in FIG. 20. FIG. 21 shows the entire opening area, which is a hole in this example.

As described with reference to FIGS. 20 and 21, an area-selective deposition process according to an example can easily reduce the critical dimension (CD) of a hole area formed in a three-dimensional stack structure. The hole area may be a plug hole area, for example. The hole is disclosed as an example, and the area-selective deposition process according to examples of the present disclosure may be utilized to other trench patterns which need a reduction in CD.

Figure 22:
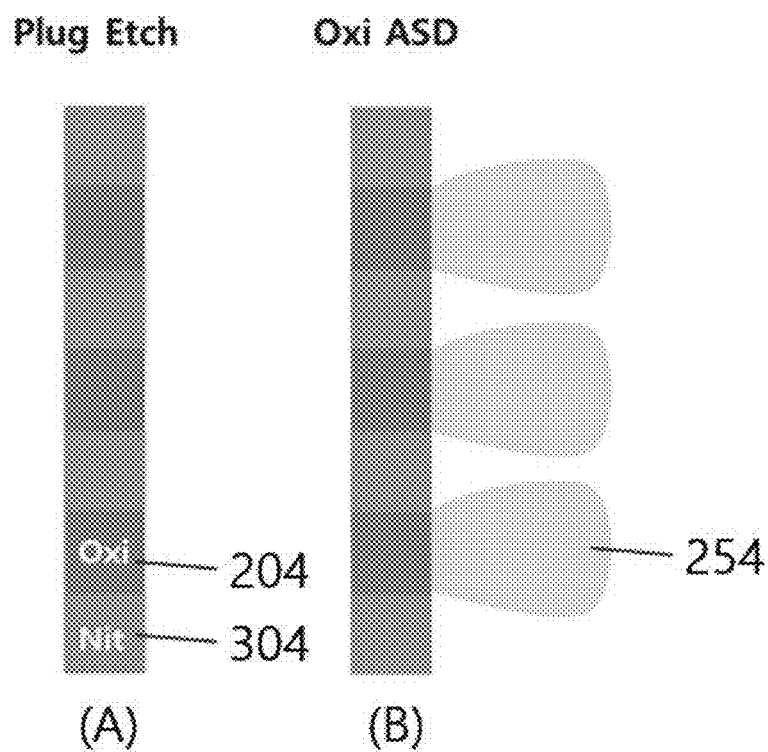
FIG. 22 is a cross-sectional view illustrating a problem of an area-selective deposition process according to a comparative example.

FIG. 22 is a cross-sectional view illustrating a problem of an area-selective deposition process according to a comparative example.

Referring to FIG. 22, in step (A), a stack structure in which a silicon nitride thin film 304 and a silicon oxide thin film 204 are alternately and repeatedly stacked may be provided. A predetermined opening area, for example, a hole may be formed in a part of the stack structure. In this figure, for the sake of convenience, only a stack portion disposed at one side of the opening area is shown.

In step (B), a silicon oxide layer 254 may be formed on a side surface of the silicon oxide thin film 204 in the opening area by using an area-selective deposition process according to a comparative example. In this case, a mushroom effect may appear as the thickness of the deposited silicon oxide layer 254 increases, and a shape distortion problem in which the width of the oxide silicon layer 254 increases toward the end portion thereof may occur.

Figure 23:
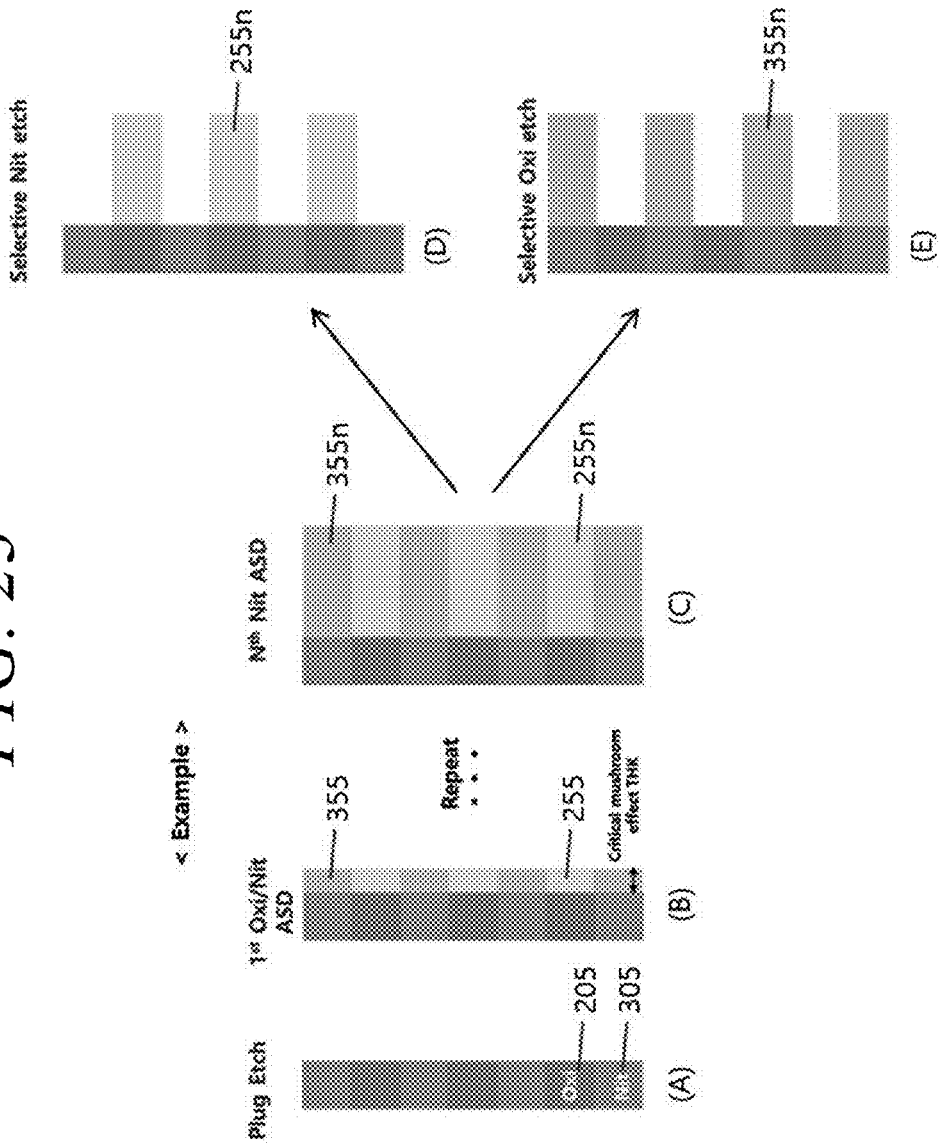
FIG. 23 is a cross-sectional view showing an example of a device fabrication process using an area-selective deposition process, according to another example of the present disclosure.

FIG. 23 is a cross-sectional view showing an example of a device forming process to which an area-selective deposition process is applied, according to another example of the present disclosure.

Referring to FIG. 23, in step (A), a stack structure in which a silicon nitride thin film 305 and a silicon oxide thin film 205 are alternately and repeatedly stacked may be provided. A predetermined opening area (e.g., a hole) may be formed in a part of the stack structure. In this figure, for the sake of convenience, only a stack portion disposed at one side of the opening area is shown.

In step (B), a first silicon oxide layer 255 may be formed on a side surface of the silicon oxide thin film 205 in the opening area by using an area-selective deposition process according to an example. This may be referred to as a first oxide ASD process. The thickness of the first silicon oxide layer 255 may be up to a maximum thickness which does not cause a mushroom effect, that is, a critical mushroom effect thickness. In addition, in step (B), a first silicon nitride layer 355 may be formed on a side surface of the silicon nitride thin film 305 in the opening area by using a conventional selective deposition process. This may be referred to as a first nitride ASD process. The thickness of the first silicon nitride layer 355 may be substantially the same as or similar to that of the first silicon oxide layer 255.

The oxide ASD process and the nitride ASD process described in step (B) may be alternately repeated. Step (C) in the figure shows the result of repeating the oxide ASD process and the nitride ASD process up to an N-th order. Here, reference numeral 255n denotes an N-th order silicon oxide layer, and reference numeral 355n denotes an N-th order silicon nitride layer.

After step (C), in step (D), the N-th order silicon nitride layer 355n may be selectively etched and removed. In this case, the N-th order silicon oxide layer 255n may remain.

In another example, after step (C), in step (E), the N-th order silicon oxide layer 255n may be selectively etched and removed. In this case, the N-th order silicon nitride layer 355n may remain.

As described above, when an area-selective deposition process according to an example of the present disclosure is applied, an ASD process may be performed to deposit a thickness equal to or smaller than the critical mushroom effect thickness to minimize or prevent the mushroom effect.

According to an example of the present disclosure, as described with reference to FIG. 14, when it is determined that the critical incubation cycle has been reached, the surfaces of the silicon oxide area and the silicon nitride area may be subjected to a surface treatment in a seventh step (S17). The surface treatment may be carried out with an HF solution. The surface treatment may also be performed according to a period in which a critical incubation cycle is reached. Therefore, the ratio of H and F elements contained in an ASD $SiO_2$ thin film may be increased every period by an amount corresponding to or less than the critical incubation thickness (e.g., about 4 nm or less). In some cases, these features may also appear in ASD $Si_3N_4$ films.

FIG. 24 illustrates analysis data showing a case where the ratio of H and F elements contained in an ASD $SiO_2$ thin film is increased every period corresponding to a critical incubation thickness. However, the data of FIG. 24 are merely exemplary, and the results may be varied depending on specific conditions of the process.

According to examples of the present disclosure described above, it is possible to implement an area-selective deposition method which can overcome the limitations and problems of conventional top-down deposition and device fabrication, and can extend the freedom of a method for deposition and patterning with respect to various substrate structures including a three-dimensional structure. In particular, an area-selective deposition method according to an example of the present disclosure can be advantageously applied to the manufacture of three-dimensional V-NAND devices and high aspect ratio/highly integrated devices, and can provide additional options for precisely and efficiently forming various structures in a device integration process.

An area-selective deposition method according to an example can be advantageously applied in the manufacture of various types of electronic devices including a three-dimensional V-NAND device. For example, an area-selective deposition method according to an example can be usefully applied to the formation of a patterned discontinuous CTN and the reduction of the CD of an opening area (e.g., a hole) in the fabrication of a three-dimensional V-NAND device. In addition, an area-selective deposition method according to an example can be applied to fabricate not only V-NAND devices but also other various electronic devices. For example, an area-selective deposition method according to an example can be applicable to all the electronic device fields including NAND, DRAM, transistors, MEMS, etc.

In the case of a three-dimensional NAND flash device, as the distance between Z-axis cells decreases with continuous ON pitch scaling, the problem of interference between adjacent cells occurs, which is solved by CTN isolation. Since it is difficult to apply a conventional patterning technique such as a lithography process inside a plug hole, a new bottom-up 3D patterning process is provided. An area-selective deposition method according to an example of the present disclosure may follow the direction of the development of three-dimensional NAND flash technology described above, and can provide a bottom-up three-dimensional patterning process in the field of three-dimensional NAND flash. Accordingly, ultra-precision area-selective deposition/patterning methods according to an example of the present disclosure are expected to work advantageously with the development of next generation NAND flash device and related markets. However, examples of the present disclosure can be variously applied not only to the three-dimensional NAND field, but also to all other electronic device fields.

While certain examples of the present disclosure have been disclosed herein, and although specific terms have been used, they are used merely in a general sense to readily describe the technical contents of the present disclosure and to aid in understanding the present disclosure, and are not intended to limit the scope thereof. It is obvious to those skilled in the art that other modifications based on the technical concept of the present disclosure can be achieved in addition to the examples disclosed herein. Those skilled in the art will appreciate that an area-selective deposition method according to the examples described with reference to FIGS. 1 to 24 and a method of manufacturing an electronic device to which the above method is applied can be variously substituted, changed and modified without departing from the technical concept of the present disclosure. Therefore, the scope of the present disclosure should not be defined by the described examples but by the technical concepts described in the claims.

DESCRIPTION OF REFERENCE NUMERALS OF MAJOR PARTS IN THE DRAWINGS

100: substrate
200, 210: silicon oxide areas
250, 260: silicon oxide layers
300, 310: silicon nitride areas
360: silicon nitride layer
P10: silicon precursor
P20: inhibitor precursor
R10: oxygen source
H10: opening area

What is claimed is:

1. An area-selective deposition method comprising:
   providing a substrate structure comprising a silicon oxide area having a surface with a first functional group and a silicon nitride area having a surface with a second functional group; and
   performing an atomic layer deposition (ALD) process on the substrate structure in a chamber to selectively form a silicon oxide layer on the silicon oxide area among the silicon nitride area and the silicon oxide area, the ALD process comprising:
   a first supply step of supplying an aminosilane-based silicon precursor into the chamber;
   a first purge step of purging the chamber with a first purge gas;
   a second supply step of supplying an oxygen-containing source into the chamber; and
   a second purge step of purging the chamber with a second purge gas,
   wherein the ALD process further comprises introducing a reaction inhibitor selectively on the silicon nitride area among the silicon oxide area and the silicon nitride area, and
   wherein an inhibitor precursor material for the reaction inhibitor forms $Si(CH_3)_3$ on the silicon nitride area.

2. The method of claim 1, further comprising, before performing the ALD process:
   performing a surface treatment on the silicon oxide area and the silicon nitride area of the substrate structure to form the first functional group on the surface of the silicon oxide area and to form the second functional group on the surface of the silicon nitride area.

3. The method of claim 2,
   wherein the surface treatment is performed with a solution comprising hydrogen fluoride (HF).

4. The method of claim 2, wherein the surface treatment is performed using a plasma comprising fluorine or a gas comprising the fluorine.

5. The method of claim 1, wherein the first functional group comprises —OH, and the second functional group comprises —$NH_2$.

6. The method of claim 1, wherein the aminosilane-based silicon precursor comprises diisopropylamino silane (DIPAS).

7. The method of claim 1, wherein the aminosilane-based silicon precursor is selectively adsorbed to the first functional group among the first functional group and the second functional group to form $SiH_3$ on the silicon oxide area.

8. The method of claim 1, wherein the oxygen-containing source comprises ozone ($O_3$).

9. The method of claim 1, wherein a processing temperature of the ALD process is 150° C. or less.

10. The method of claim 1, wherein forming the silicon oxide layer further comprises alternately and repeatedly performing:
    a repeating deposition step of repeating the first supply step, the first purge step, the second supply step, and the second purge step multiple times; and
    an etching step of performing an etching process on the silicon oxide area and the silicon nitride area after the repeating deposition step.

11. The method of claim 1, wherein introducing the reaction inhibitor comprises, between the first purge step and the second supply step:
    a third supply step of supplying an inhibitor precursor material into the chamber; and a third purge step of purging the chamber with a third purge gas.

12. An area-selective deposition method comprising:
providing a substrate structure comprising a silicon oxide area having a surface with a first functional group and a silicon nitride area having a surface with a second functional group; and
performing an atomic layer deposition (ALD) process on the substrate structure in a chamber to selectively form a silicon oxide layer on the silicon oxide area among the silicon nitride area and the silicon oxide area, the ALD process comprising:
  a first supply step of supplying an aminosilane-based silicon precursor into the chamber;
  a first purge step of purging the chamber with a first purge gas;
  a second supply step of supplying an oxygen-containing source into the chamber; and
  a second purge step of purging the chamber with a second purge gas,
  wherein the ALD process further comprises introducing a reaction inhibitor selectively on the silicon nitride area among the silicon oxide area and the silicon nitride area, and
  wherein an inhibitor precursor material for the reaction inhibitor comprises N,N-diethylamino trimethylsilane (DEATMS).

13. The method of claim 1, further comprising:
forming a silicon nitride layer selectively on the silicon nitride area among the silicon oxide area and the silicon nitride area after the forming of the silicon oxide layer.

14. The method of claim 1, wherein the substrate structure comprises a stack structure in which a silicon oxide thin film and a silicon nitride thin film are alternately and repeatedly stacked on an upper surface of a substrate,
  wherein the stack structure has at least one opening extending in a direction in which the silicon oxide thin film and the silicon nitride thin film are stacked,
  wherein selectively forming the silicon oxide layer includes forming silicon oxide over side surfaces of the silicon oxide thin film layers exposed to an inner surface of the opening.

15. The method of claim 1, wherein the substrate structure comprises at least one silicon oxide area and at least one silicon nitride area arranged on an upper surface of a substrate in a direction parallel to a main surface of the substrate.

16. A method of fabricating an electronic device, the method comprising:
providing a substrate structure comprising a silicon oxide area and a silicon nitride area; and
forming a material film on the substrate structure by using the area-selective deposition method of claim 1.

17. The method of claim 16, wherein the electronic device comprises a three-dimensional V-NAND device.

18. The method of claim 17, wherein the substrate structure comprises a stack structure in which a silicon oxide thin film and a silicon nitride thin film are alternately and repeatedly stacked on an upper surface of a substrate,
  wherein the stack structure has at least one opening extending through the stack structure, and
  wherein selectively forming the silicon oxide layer includes forming silicon oxide over a side surface of the silicon oxide thin film exposed to an inner surface of the opening by using the area-selective deposition method.

* * * * *